(12) United States Patent
Otsuka et al.

(10) Patent No.: US 7,173,449 B2
(45) Date of Patent: Feb. 6, 2007

(54) SIGNAL TRANSMISSION SYSTEM

(76) Inventors: Kanji Otsuka, 1074-38, Kohan 2-chome, Higashiyamato-shi, Tokyo (JP); Tamotsu Usami, 38-4, Nishimachi 2-chome, Kokubunji-shi, Tokyo (JP)

( * ) Notice: Subject to any disclaimer, the term of this patent is extended or adjusted under 35 U.S.C. 154(b) by 421 days.

(21) Appl. No.: 10/353,040

(22) Filed: Jan. 29, 2003

(65) Prior Publication Data
US 2003/0143964 A1   Jul. 31, 2003

(30) Foreign Application Priority Data
Jan. 31, 2002  (JP) ............................ 2002-022708

(51) Int. Cl.
*H03K 17/16* (2006.01)
*H03K 19/0175* (2006.01)

(52) U.S. Cl. .......................................... 326/30; 326/86

(58) Field of Classification Search .................. 326/21, 326/23, 27, 30, 90, 83, 86, 89
See application file for complete search history.

(56) References Cited

U.S. PATENT DOCUMENTS

| 5,512,853 | A  | * | 4/1996 | Ueno et al. | .................. | 327/333 |
| 5,781,028 | A  |   | 7/1998 | Decuir | ........................ | 326/30 |
| 6,373,275 | B1 |   | 4/2002 | Otsuka et al. | ..................... | 326/30 |
| 2001/0013075 | A1 |   | 8/2001 | Otsuka et al. | ................. | 710/33 |
| 2002/0044012 | A1 |   | 4/2002 | Otsuka et al. | ............... | 327/586 |

FOREIGN PATENT DOCUMENTS

| JP | 11-284126 | 10/1999 |
| JP | 2000-83069 | 3/2000 |
| JP | 2001-211211 | 8/2001 |
| JP | 2000-174505 | 4/2002 |
| JP | 2002-124635 | 4/2002 |

OTHER PUBLICATIONS

Ghani, T. et al., "Asymmetric Source/Drain Extension Transistor Structure for High Performance Sub-50nm Gate Length CMOS Devices", *2001 Symposium on VLSI Technology Digest of Technical Papers*, Jun. 2001.
U.S. Appl. No. 10/348,896, filed Jan. 23, 2003, Otsuka et al.
U.S. Appl. No. 10/307,521, filed Dec. 2, 2002, Otsuka et al.

* cited by examiner

*Primary Examiner*—Daniel Chang
(74) *Attorney, Agent, or Firm*—Miles & Stockbridge P.C.

(57) ABSTRACT

Signal transmission technology for transmitting 20–50 GHz band digital high speed signals, while keeping to the system structure and element structure of the prior art is provided. A signal transmission system is provided in which the driver and the receiver comprise the logic circuit and the memory circuit for a transistor extending an entire electronic circuit, and wherein the driver is connected to the receiver via a signal transmission line, and to the power source Vdd via the power source/ground transmission line, and the receiver circuits and the driver and receiver all have substantially differential input and differential output, and at the output terminal of the substantially differential output of the driver there are no connections to a power source or a ground and the receiver receives signals by detecting potential difference of a substantially differential input signal and there are no distribution wires in the signal transmission lines.

11 Claims, 22 Drawing Sheets

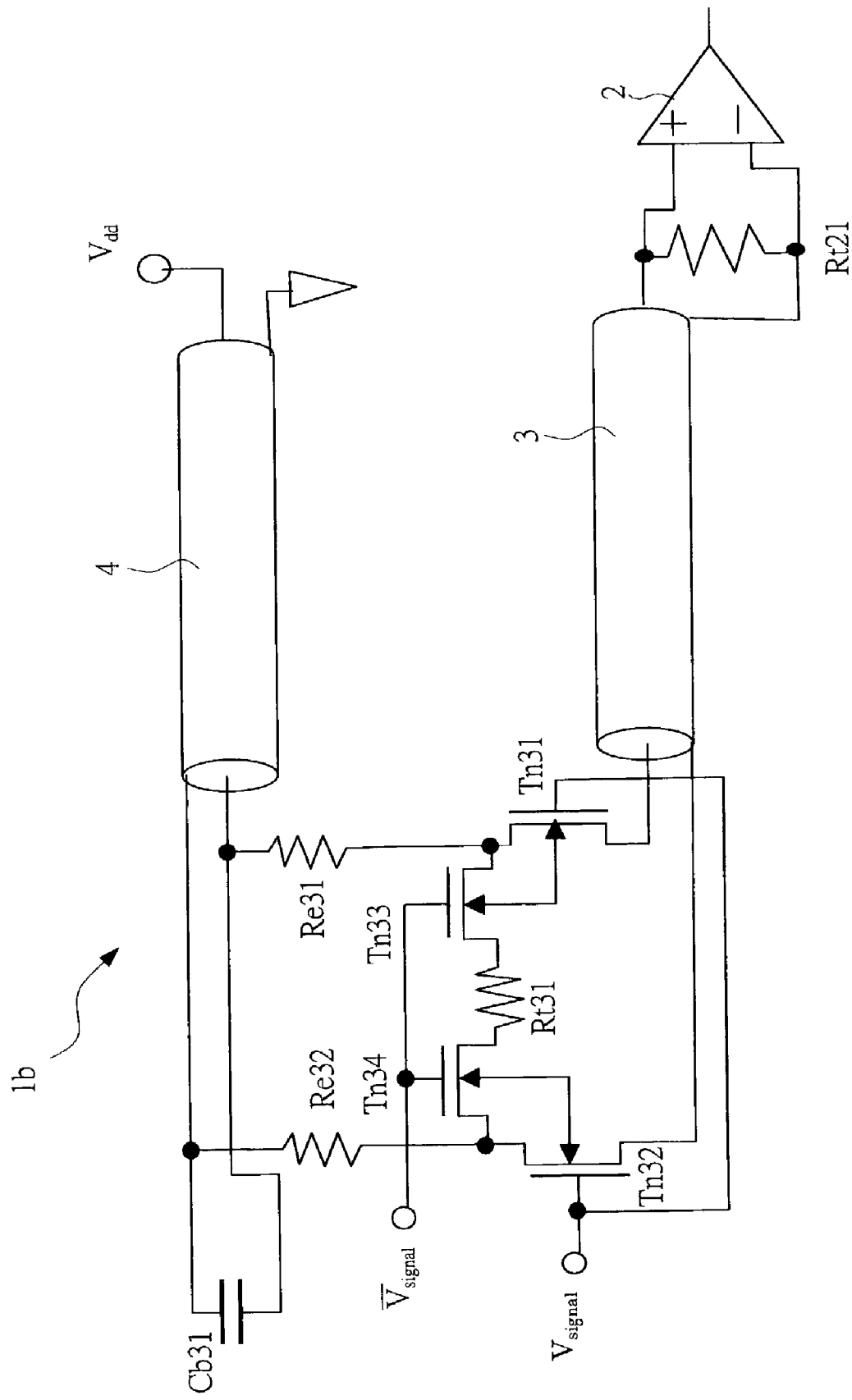

SIGNAL TRANSMISSION SYSTEM

TECHNICAL FIELD OF THE INVENTION

The present invention relates to a signal transmission system, and particularly, to application effective to signal transmission technology for transmitting over 10 GHz band digital high speed signals, while keeping the system and element configuration of the prior art available.

BACKGROUND OF THE INVENTION

According to studies carried out by the inventors of the present invention, existing signal transmission system technology is as described in the following.

In recent years, the clock frequency for operating the LSI chip has reached 1.5 GHz. However the maximum frequency of the lines connected to the chips that handle these signals is a mere 530 MHz. Thus the band width for incorporating the signals into the LSI is insufficient to meet the demands LSI. In order for the signal processing of LSI to be carried out smoothly, cache memory such as logic chips or memory chips must be implanted in order to solve the problem of insufficient band width.

SUMMARY OF THE INVENTION

It is to be noted that studies carried out by the inventors of the present invention made the following apparent about the above-described signal transmission system.

For example as described above, attempts are made to solve the problem of insufficient bandwidth by implanting cache memory. However, this not only requires a large cache memory space, but address computations become excessive and the architecture too becomes difficult. If an I/O bandwidth which matches the LSI clock is secured, the cache memory becomes unnecessary and this results in a system with simple architecture.

The basis of digital systems is that the chip I/O is essentially the same as the number of processing bits within the chip, and in order to match the bandwidth, the chip clock and the transmission clock for the I/O bus must be the same. As we enter the era of the GHz band, improvement of the bus clock becomes absolutely necessary. Even if the transmission line which is the basic component of the bus has the above-described property, the GHz clock cannot be transmitted. GHz transmission will only be possible after all the package structures, including the driver and the receiver, are ready for transmission of high speed signals.

In predicting future developments for the inside of the chip, the following is considered. A MOS structure having a gate length of 20 nm was announced at the 2001 Symposium on VLSI Technology (June 2001, Kyoto) and work is being done so 20 GHz digital signal processing can be carried out. This is expected to be realized in 2007. Over 10 GHz digital signals cannot even be transmitted by wires inside a 10 mm square chip. In order to create a unified environment for the entire system, a system structure with a fundamentally novel concept is needed.

Thus the object of the present invention is to provide signal transmission technology for transmitting at least 20–50 GHz band digital high speed signals, while keeping the system and element configuration of the prior art as much as possible.

The above-mentioned objects, as well as other objects of the invention, and the novel features of the invention will be evident from the descriptions in this specification, as well as from the accompanying drawings.

The following is a brief outline of the typical structure disclosed in the invention of the present application.

The general principle of the present invention is fabricating a structure which eliminates common ground and common power source for the circuit. Pulse signal transmission in the GHz band requires that the process by which the pulse energy (electric load amount) is moved in the circuit or line has minimal restrictions. It is also important for the disconnected points which cause reflection to be eliminated. Diligent efforts to provide this resulted in the concepts of the present invention.

Specifically, the signal transmission system of the present invention has the following features.

(1) The logic and memory circuit of the transistor (including the driver and the receiver) for the entire electronic circuit all have substantially differential input and differential output there is no distribution circuit. The circuit configuration is such that there is no connection to the power source or ground at the output terminal of the sending end (difference pair end). The signal is received by the receiver detecting potential difference of the substantially differential signal.

(2) In the power supply line in (1) is a power source/ground pair transmission line, and each element circuit of the smallest logic element circuit and memory element circuit, is connected by a dedicated pair line. It is to be noted that the dedicated pair line for the power source/ground 1 is defined as the one closest when approached from the bypass condenser (front line base power source).

(3) Characteristic impedance of the power source/ground pair transmission line is equal to or less than the total array impedance of the signal driver lines from the source/ground pair transmission line.

(4) All signal transmission lines (pair lines) from the transistor output port, to the transistor input port to be connected thereto are pair lines, and only wires which approach a transistor contact portion geometrically are stand-alone (independent) wires, and the stand-alone wires are equal to or shorter than a gate pitch.

(5) The signal transmission lines from the differentially input transmitter output port (sending end), all match the characteristic impedance up to the transistor entrance of an end terminal of the receiver circuit, and a resistor which matches with an end terminal is provided and for connection portions such as an interlayer connection column, a via-hole, and a connection stud (bump) whose impedance do not match, if the time delay of an electromagnetic wave for discontinuous portion of said connection portions is represented by tpd; pulse rise time is represented by tr; and pulse fall time is represented by tf, then tr>7tpd and tf< 7tpd. When the interlayer connection column, a pair hole and the like can be matched the characteristic impedance, it is not limited.

(6) All of the connection lines (signal transmission lines and the power source/ground pair transmission line) have a configuration in which the TEM mode is maintained. For configurations in which electromagnetic waves leak into the air, the portion that leaks the electromagnetic waves is coated with a material having high specific dielectric constant such that an effective specific dielectric constant is matched with the specific dielectric constant of an inner portion dielectric constant.

(7) The signal transmission line is one of a pair coplanar line; a stacked pair line; a guard stacked pair line; and a guard coplanar line. The distance between adjacent pair lines is not less than twice the space of the pair line itself in the cases of the pair coplanar line and stacked pair line, and not less one time the space of the pair line itself in the cases of the guard stacked pair line and the guard coplanar line.

(8) When the circuit in (1) which comprises a plurality of bits, all of the lines have relatively the same physical structure and equal wire length. They are basically parallel, but the wires of the fan-out wire are configured as an arc so as to have equal length.

(9) The driver circuit and the receiver circuit are configured to be one of a Si or SiGe n-channel MOS or a GaAs n-channel MES and a bus switch circuit with no ground connections and substantial differential input and substantial differential output circuit (FIG. 2); an inverse input nMOS difference current switch circuit (FIG. 14); a constant current type bus switch circuit (FIG. 15); and a short key high-speed bipolar difference circuit (FIG. 6) that has a varactor.

(10) All of the transistors have varactors that have the same complementary MOS, MES or bipolar transistor structure.

(11) In the case where the receiver circuit comprises adjacent complementary transistors which the inverse signal or the clock input, then the complementary transistors use each other as a varactor.

(12) The receiver circuit forms a differential amplifier circuit, and the high speed switch transistor maintains the effect of a complementary varactor with all the varactors or an inverse transistor of a similar type.

(13) The step flip-flop circuit of the driver circuit is a circuit that outputs a signal and also an inverse signal, and the same number of steps as the transistor and in which there is no skewing of either signal outputs. Also the high speed switch is similar to the varactor in 12.

BRIEF DESCRIPTIONS OF THE DRAWINGS

Figure 10A:
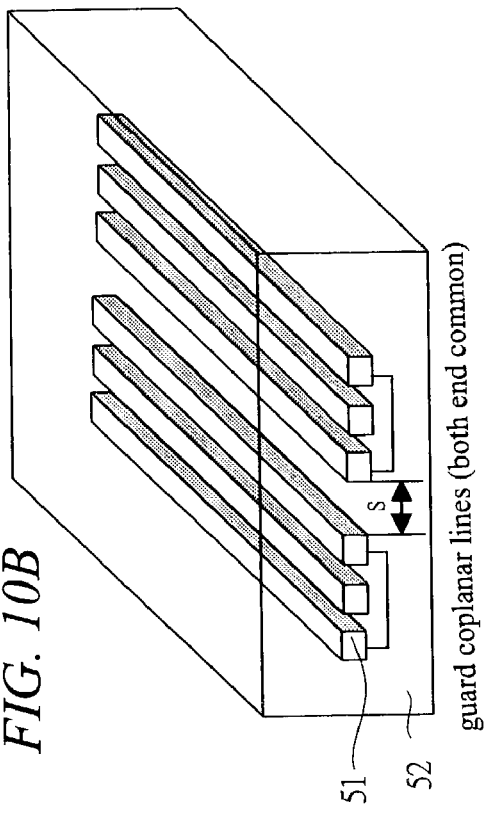
Figure 10B:
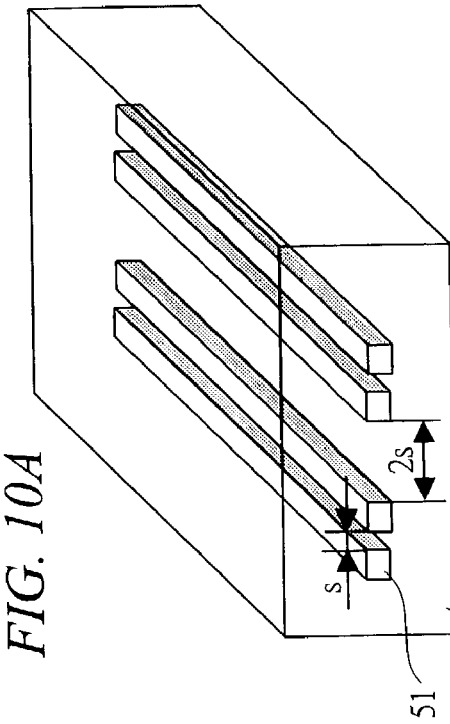
Figure 10C:
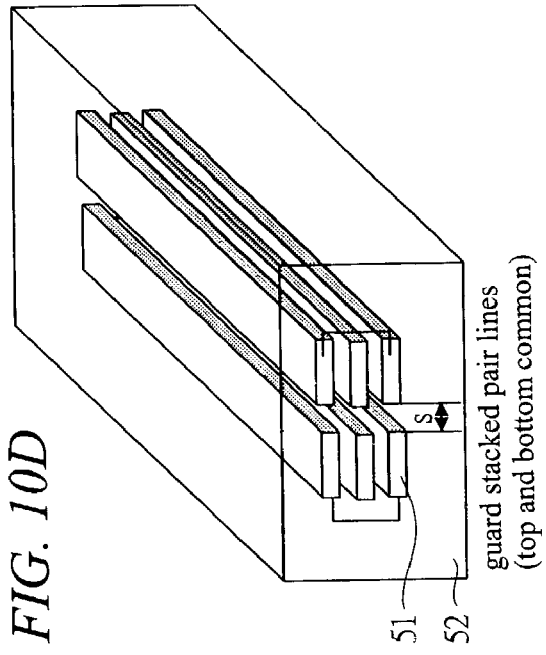
Figure 10D:
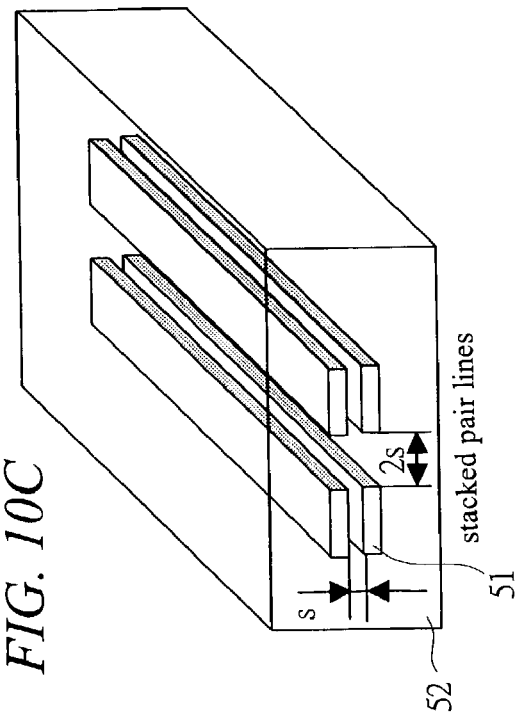

FIGS. 10A–10D show an example of a suitable transmission line of an embodiment of the present invention, wherein FIG. 10A shows the pair coplanar line; FIG. 10B shows the guard coplanar line; FIG. 10C shows the stacked pair line; and FIG. 10D shows the guard stacked pair line.

Figure 11:
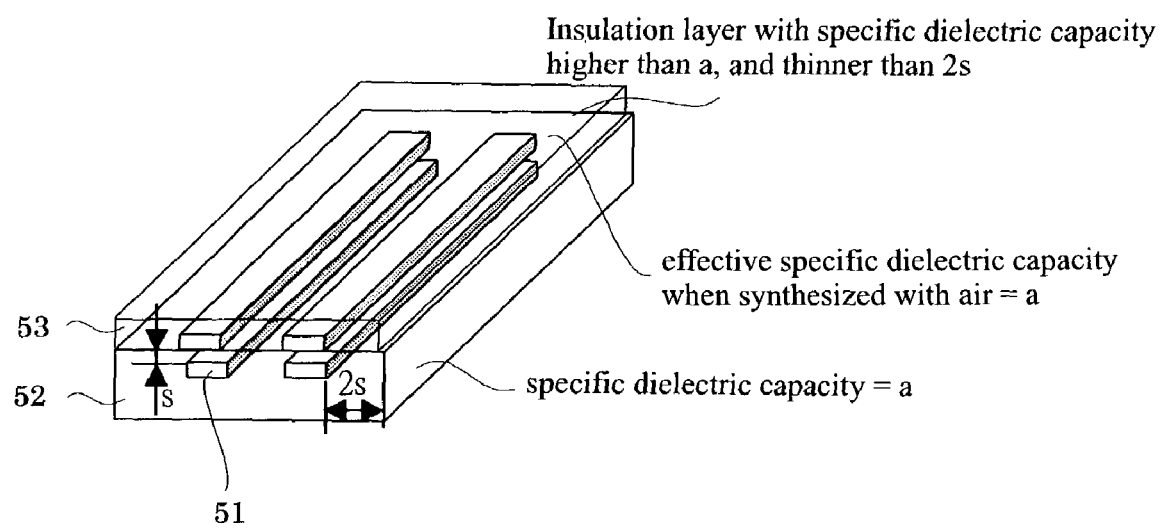

FIG. 11 shows an example the matching of the dielectric constant of the insulation layer at the periphery of the conductor in an uneven insulation layer of an embodiment of the present invention.

Figure 12B:
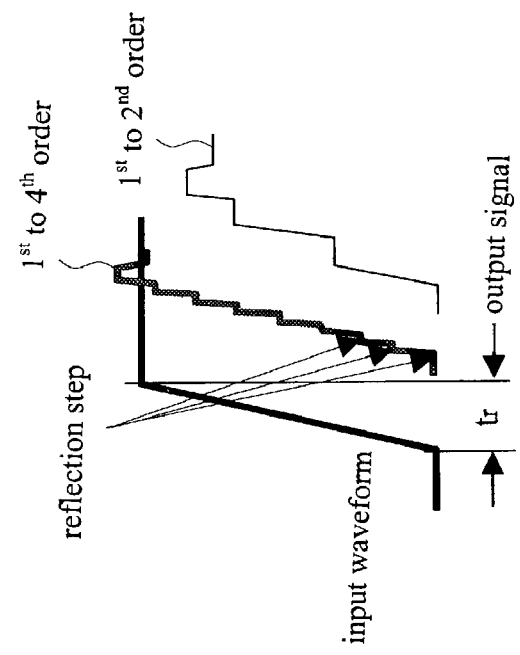
Figure 12A:
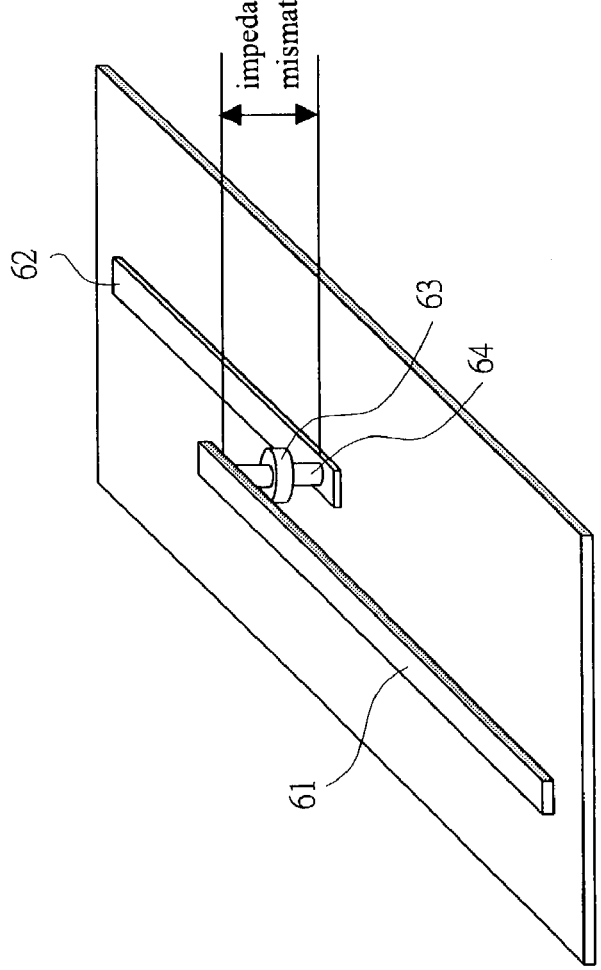

FIGS. 12A and 12B shows an example of a model of the length of the impedance of the mismatching for a column, a via-hole and the like of an embodiment of the present invention, wherein FIG. 12A shows state in which a space between lines is connected by a column and via-holes; and FIG. 12B shows an output waveform with respect to an input waveform.

Figure 13:
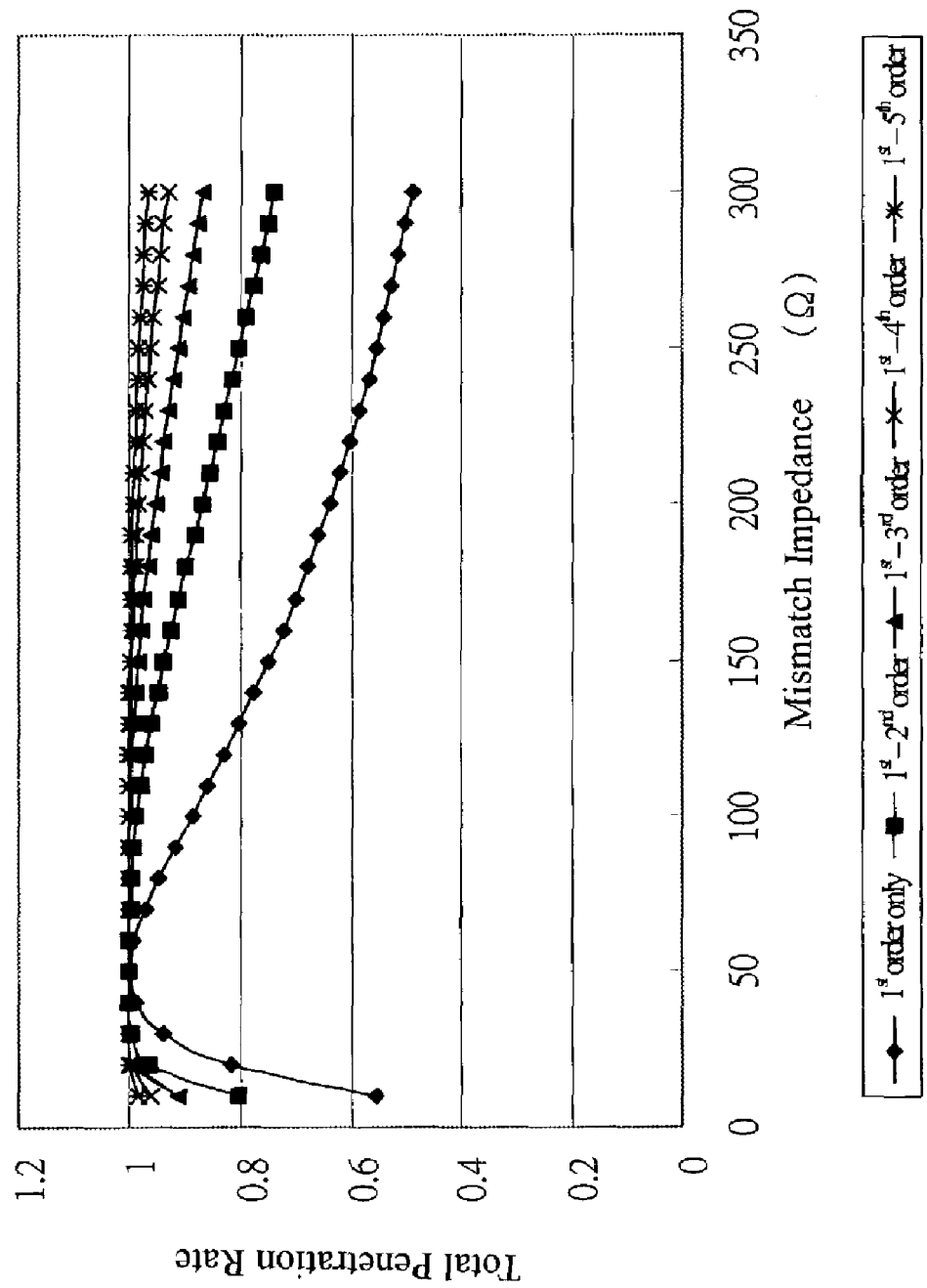

FIG. 13 shows an example of the penetration rate of the 50Ω mismatch impedance and high order energy of an embodiment of the present invention.

Figure 14:
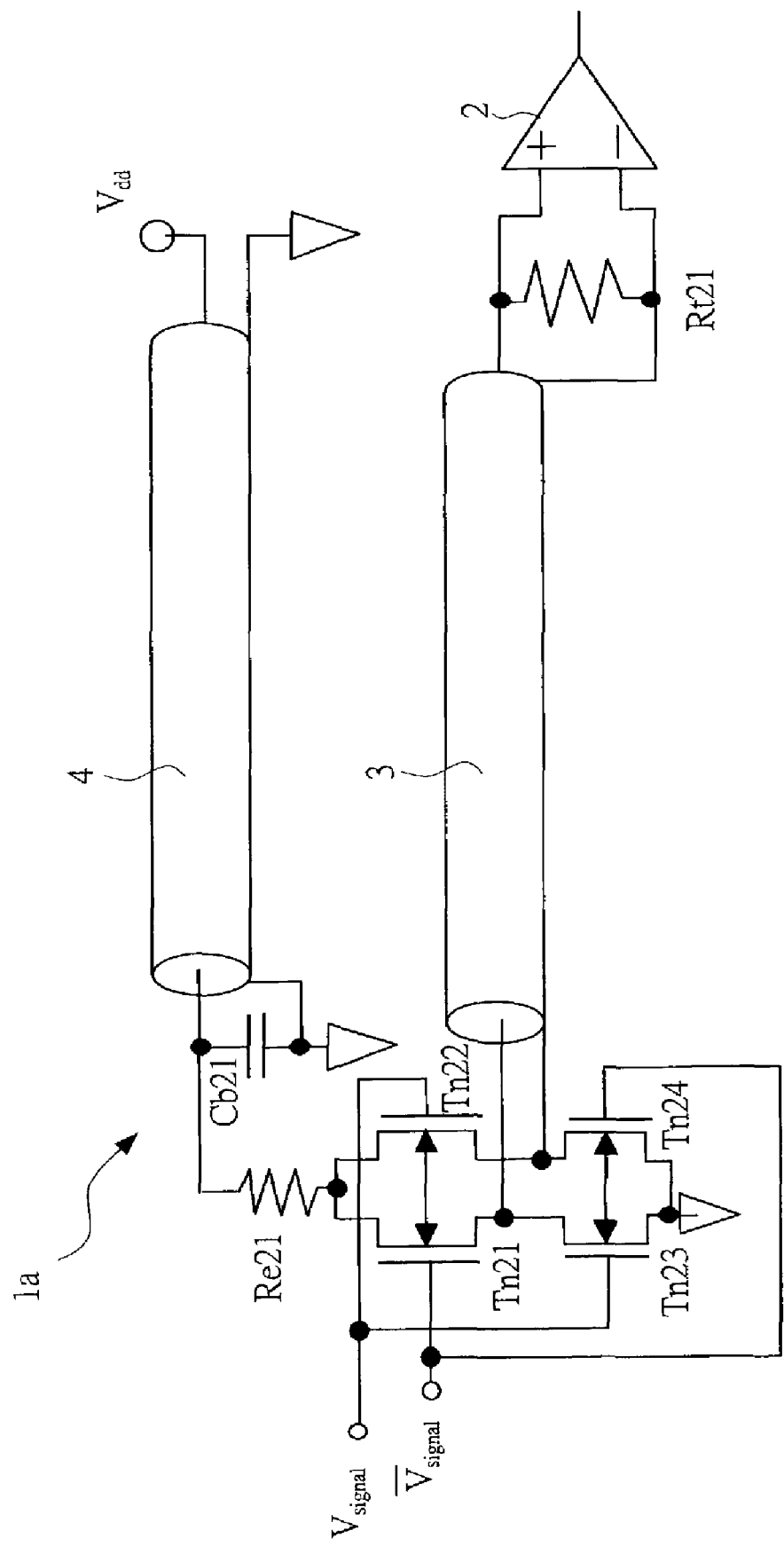

FIG. 14 shows an example of a variable type drive of an embodiment of the present invention.

FIG. 15 shows an example of a bus-switch type driver for constant current flow of an embodiment of the present invention.

Figure 16B:
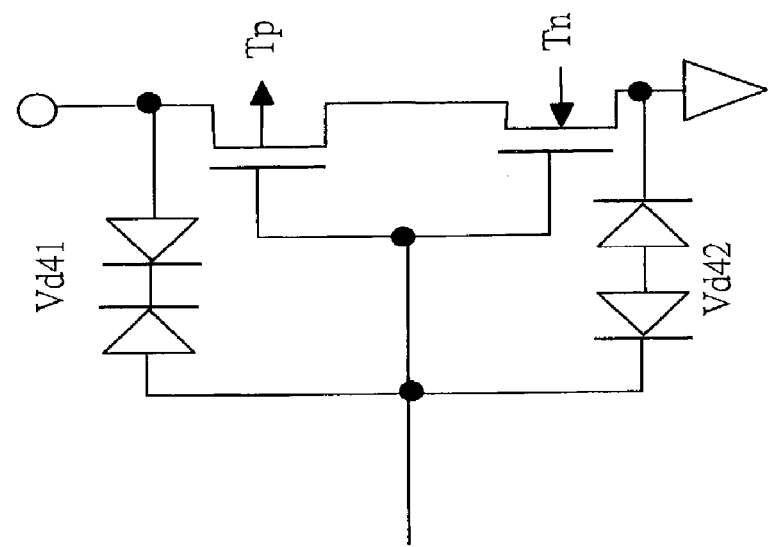
Figure 16A:
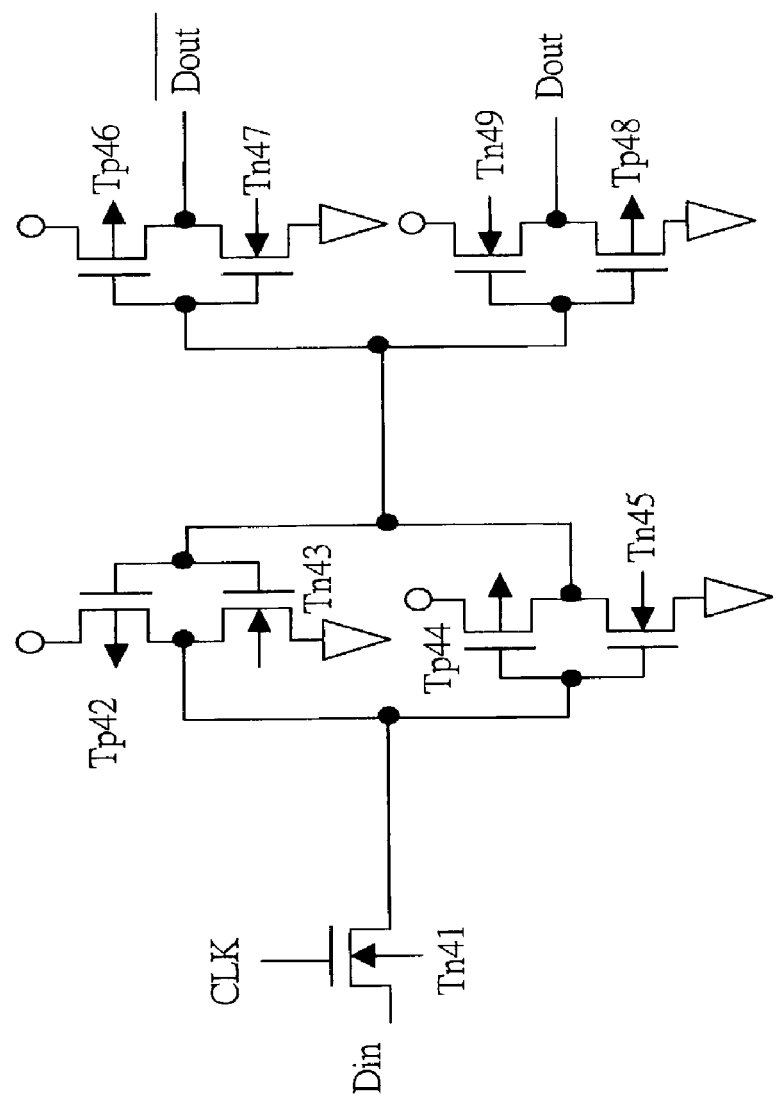

FIGS. 16A and 16B show an example of a D-type high-speed flip-flop circuit of an embodiment of the present invention, wherein FIG. 16A shows a flip-flop circuit; and FIG. 16B shows an inverter.

Figure 17:
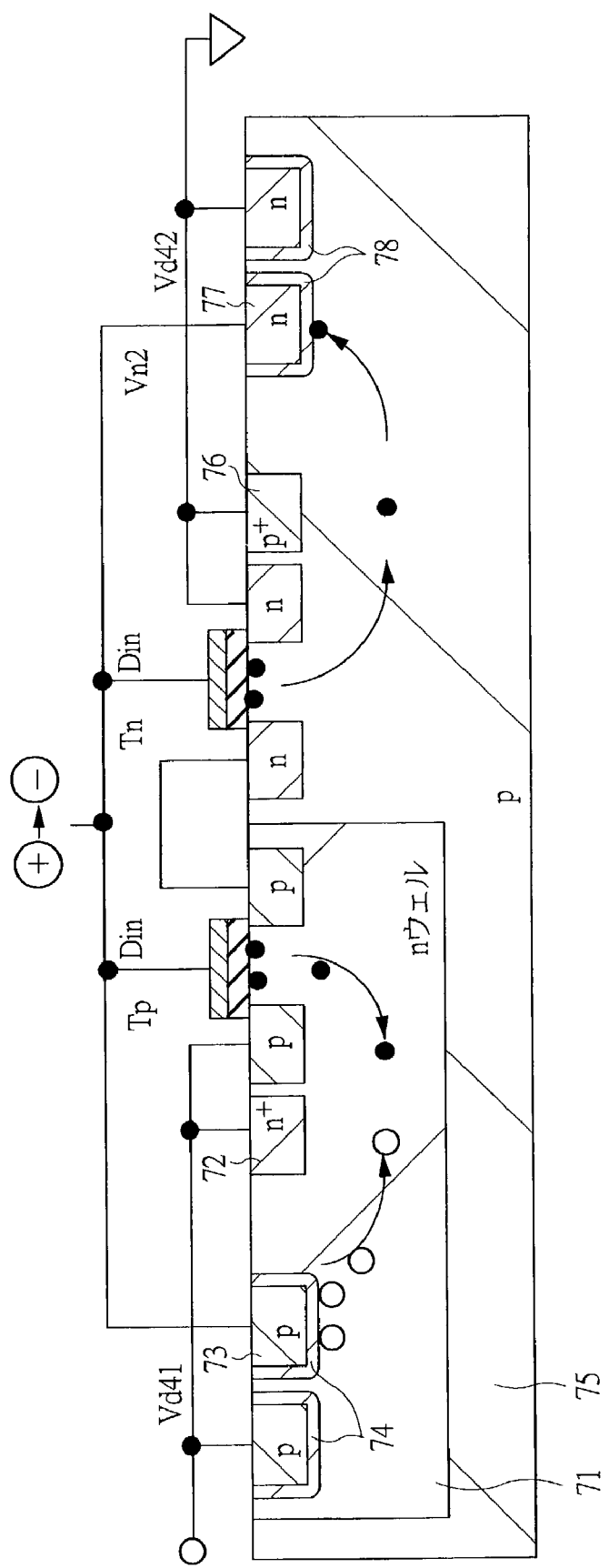

FIG. 17 shows an example of a CMOS structure with a diode varactor and the load movement thereof in an embodiment of the present invention.

Figure 18A:
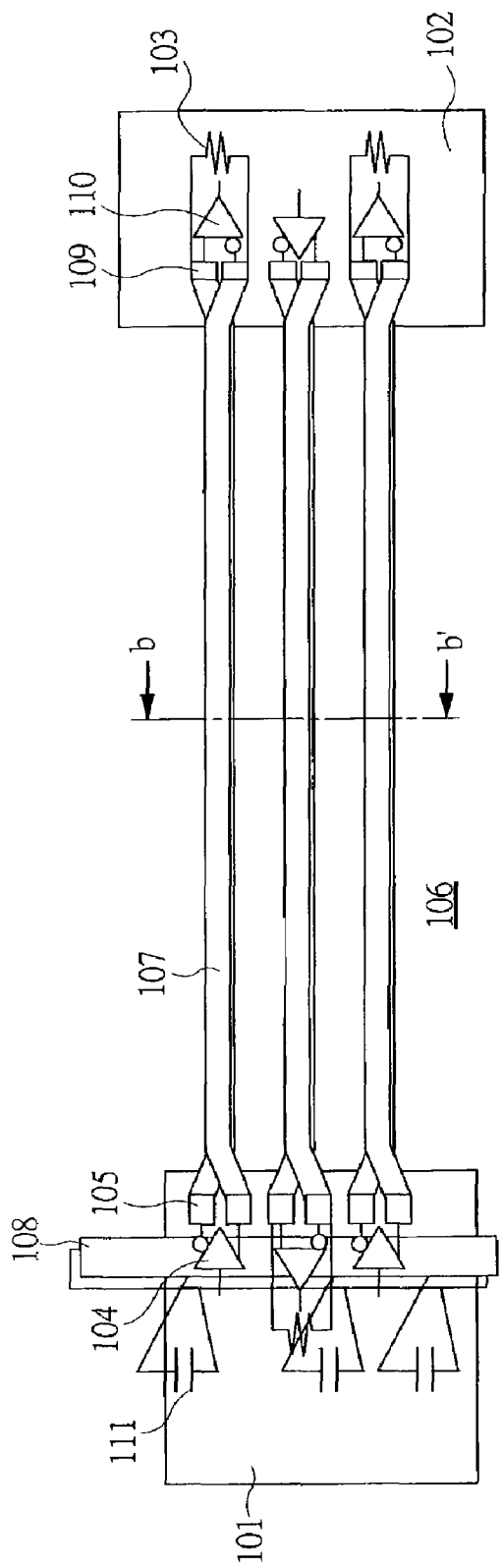
Figure 18B:
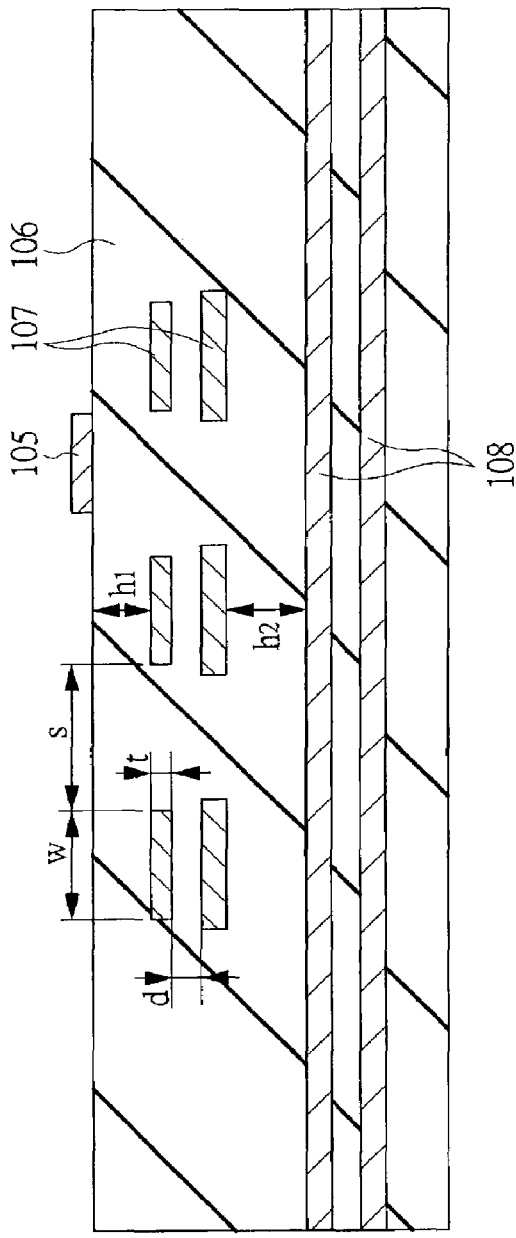

FIGS. 18A and 18B show an example of a connection structure for transmission wires between chips of an embodiment of the present invention, wherein FIG. 18A shows planar view through a chip; and FIG. 18B shows a cross-sectional view taken along line b—b of FIG. 18A.

Figure 19:
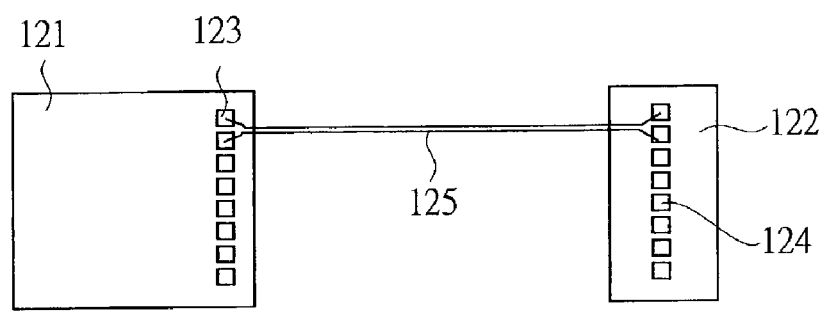

FIG. 19 shows an example of restrictions of a chip pad array of an embodiment of the present invention.

Figure 20:
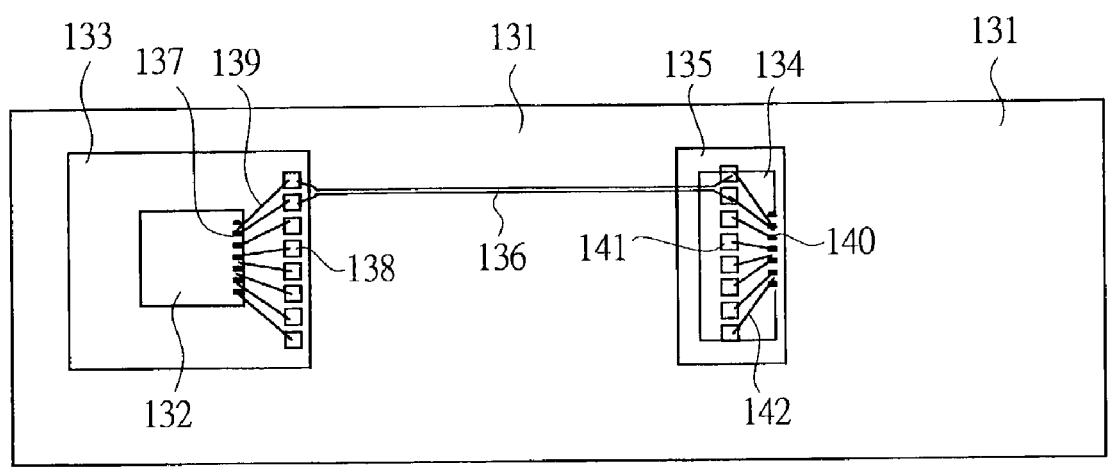

FIG. 20 shows an example of the fan-out wire structure when a package is used in an embodiment of the present invention.

Figure 21:
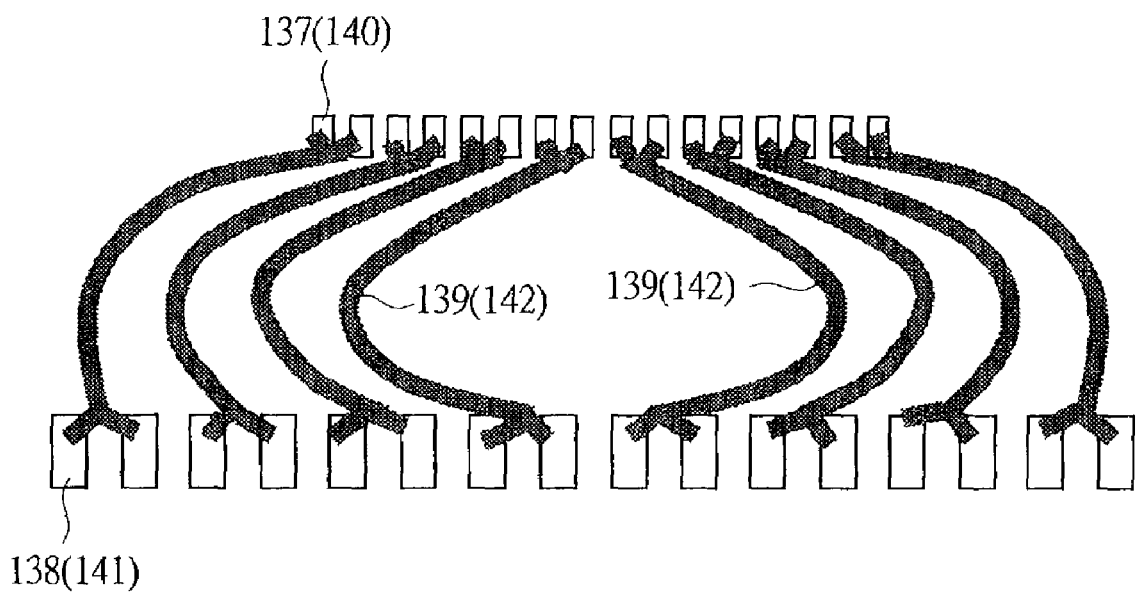

FIG. 21 shows an example of equal length fan-out wire of an embodiment of the present invention.

Figure 22:
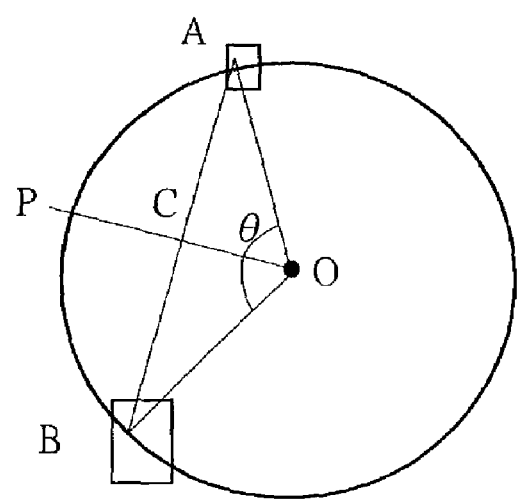

FIG. 22 shows an example of a model for fixing arc AB and varying chord AB of an embodiment of the present invention.

Figure 23:
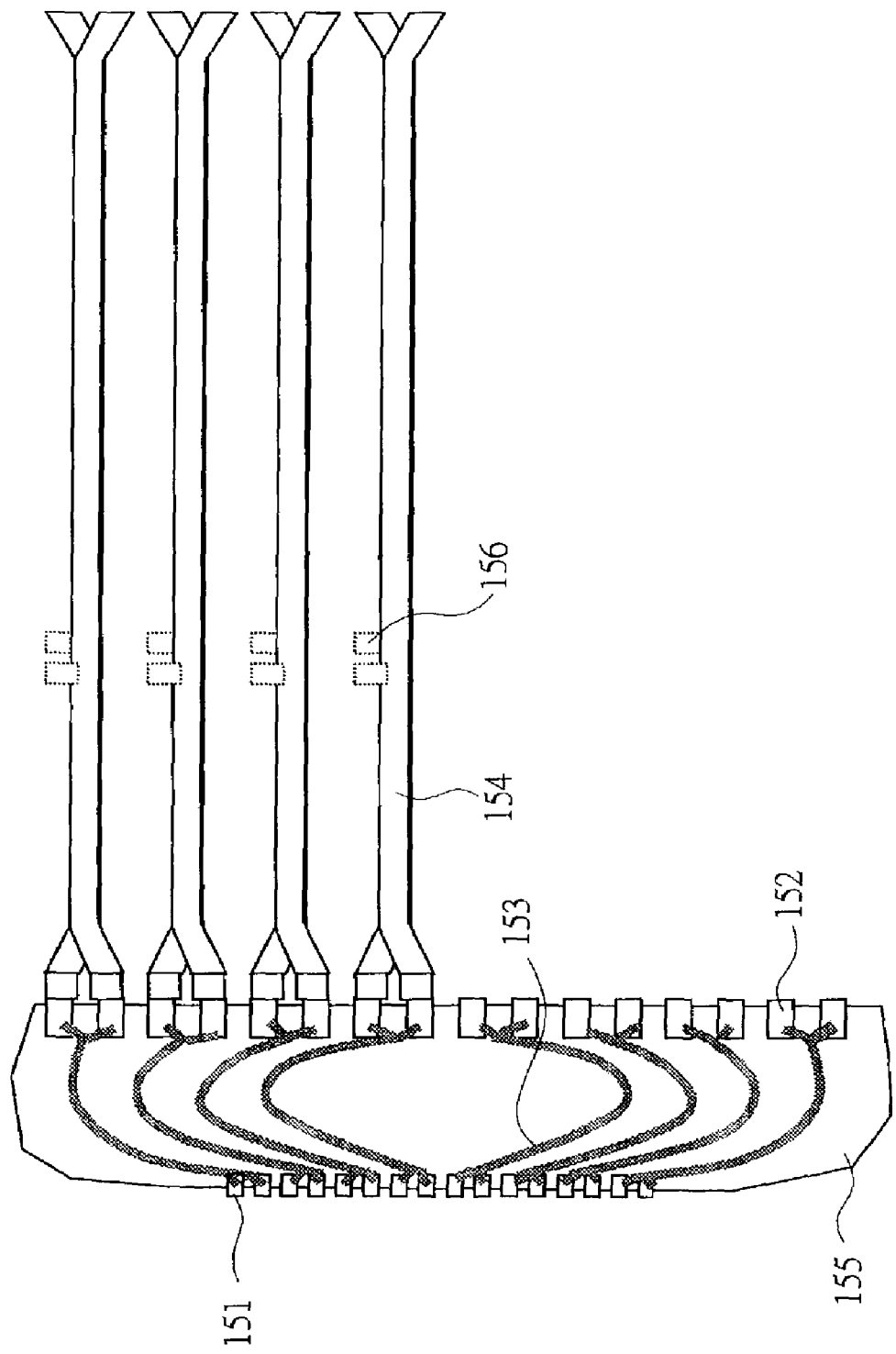

FIG. 23 shows an example of a line structure in which the distance between the pair lines are made equal and the line width is varied of an embodiment of the present invention.

Figure 24:
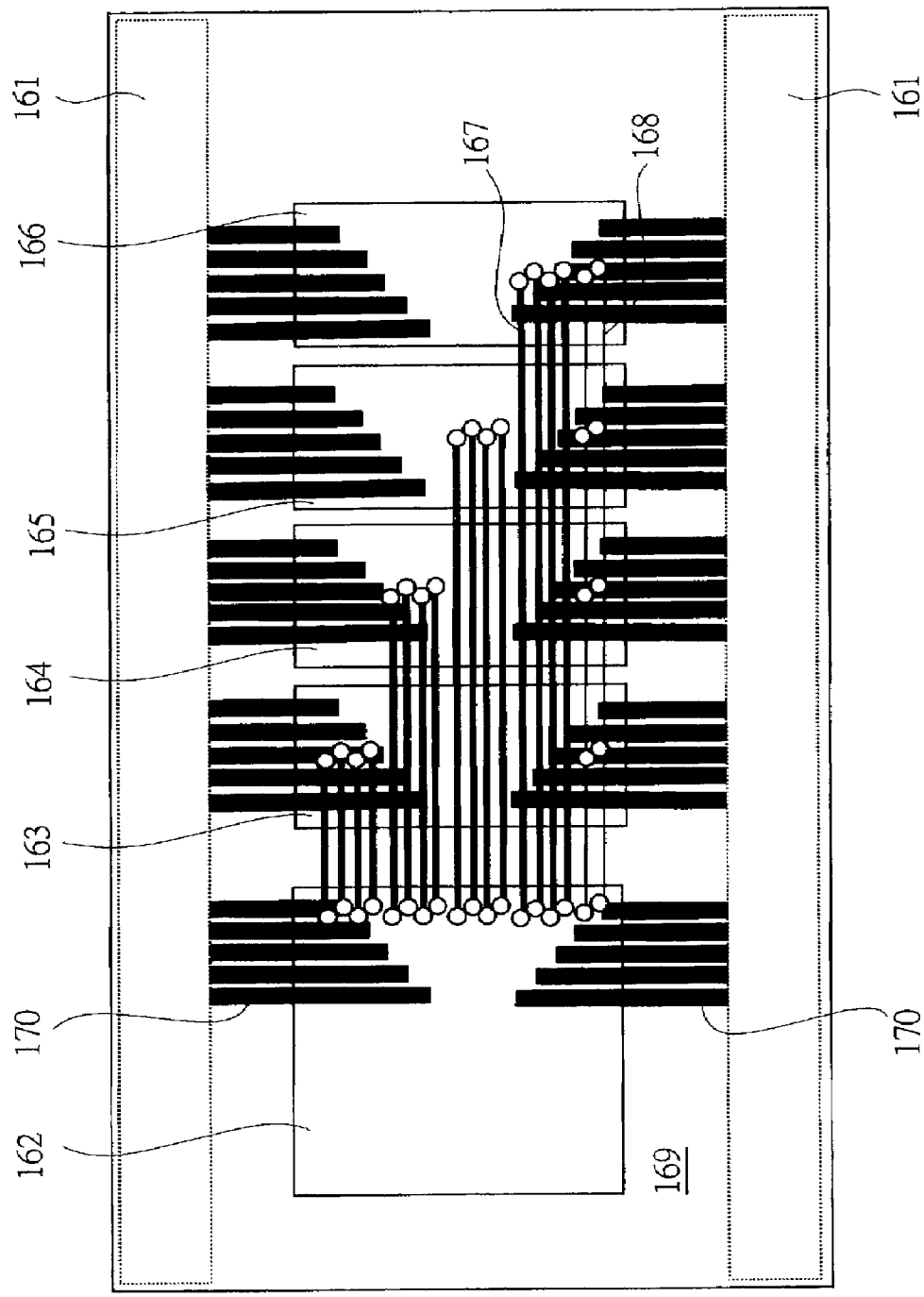

FIG. 24 shows an example line arrangement of the connections between the chip and the power source/ground pair lines of an embodiment of the present invention.

DESCRIPTION OF THE PREFERRED EMBODIMENTS

The following is a description of the embodiments of the present invention based on the accompanying drawings. It is to be noted that in all of the drawings for describing these embodiments, the same elements are assigned the same numerals and repeated descriptions thereof are omitted.

This embodiment is described as example of the signal transmission system of the present invention in the following order: 1. The LSI Chip I/O Driver and Receiver Circuit Configuration; and 2. The System Structure.

1. The LSI Chip I/O Driver and Receiver Circuit Configuration

The following structures which were previously proposed by the inventors of the present invention may be favorably used for the I/O driver and receiver circuit structure of the LSI Chip: the circuit structure including a power source and ground pair of P1 (Japanese Patent Application Laid-Open No. 11-284126) and P2 (Japanese Patent Application Laid-Open No. 2000-174505); the receiver structure of P4 (Japanese Patent Application Laid-Open No. 2001-211211); the transistor structure in which high speed signal processing is possible (recycling of lumped carrier by varactor insertion) of P9 (Japanese Patent Application No. 2000-315360); structure with bypass capacitor built in the chip of P 10 (Japanese Patent Application No. 2002-15753); and P 12 (Japanese Patent Application No. 2001-369358 in which all of the above are combined. In the following description, the portions which overlap with the technology listed above which have been proposed by the inventors of the present invention will be referred to as P1, P2, P4, P9, P10 and P12, and detailed descriptions thereof will be omitted.

Figure 2:
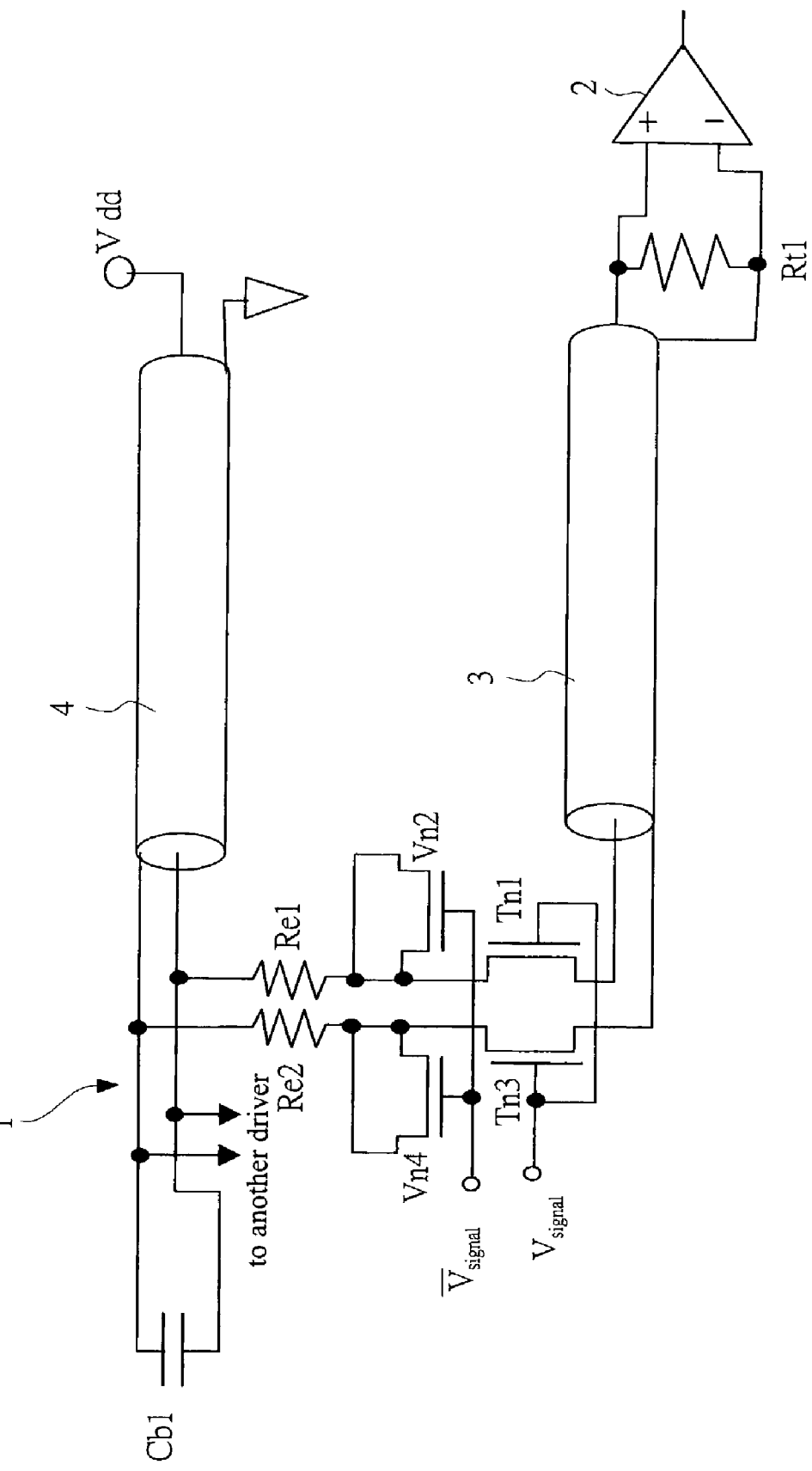
FIG. 2 is an example of a structure for connecting the driver and the receiver in an embodiment of the present invention.

First, the circuits which handle the signals in the signal transmission system of the present invention are illustrated in FIG. 2. The following is a detailed description of the signal transmission system is using FIG. 2. The driver and the receiver is described here, which makes substantial differential output possible, and includes the logic circuit and the memory circuit of the transistor which span the entire electronic circuit. One big difference between this invention and the prior art is that there is no ground connection at the transmission terminal. If the phenomenon at the time of high speed operation is not understood, the effectiveness of this invention cannot be clearly described, thus an outline of electromagnetics will first be given.

Generally a pulse is a synthesized wave including a high harmonic sine wave. Supposing that the clock frequency of the pulse is considered the fundamental wave (energy rate is approximately 70%), the pulse comprises multiples of the fundamental wave: a three multiple harmonic wave that has approximately 20% of the energy; a five multiple harmonic wave that have approximately 5% of the energy; a seven multiple harmonic wave that have approximately 1.5% of the energy; a nine multiple harmonic wave that have approximately 0.5% of the energy; and other odd-numbered multiple harmonic waves which have a small amount of the energy. When high harmonic wave that is an issue with respect energy is to be examined on the safe side, the frequency that is one-digit higher than the pulse clock frequency should be discussed. Further, for the same pulse frequency, the steeper the rise tr (fall tf) time, the higher the order of the harmonic wave, and $f=0.35/tr$, or $f=0.35/tf$ can be used in order to estimate the fundamental wave f. This is called the pulse effective frequency.

The sine wave energy which is transmitted by electromagnetic wave speed causes resonance of the transmission distance which determines the breaking point for the wave. The minimum breaking point is ¼ wavelength ($\lambda/4$). Resonance of the above-mentioned high multiple harmonic waves thus occurs. When resonance occurs, the transmission conductance is $\infty$, that is the resistance is 0 and it transmits in a manner that is very different from the limited conductance of other sine waves. That is to say the transmitted energy is amplified. In extreme cases, the harmonic waves having only a small percentage of the energy, transmits the same energy as the basic wave. This causes the pulse wave form to be greatly disrupted, and at the same time it results in electromagnetic radiation. The present invention relates to technology for the field of digital circuit design. However this explanation is for the sake of those fields in which this point of view does not constitute general awareness.

Here, the discussion will be given to up to the seventh (seven multiple) harmonic wave of a 20 GHz clock CPU which was announced at the above-mentioned 2001 Symposium on VLSI Technology. It is a 180 GHz sine wave. Because the electromagnetic wave speed of the line circuit for transmitting where the dielectric constant $\epsilon r=4$ is equal to $1.5\times10^8$ M/s, the ($\lambda/4$) of 180 GHz=21 μm. The wire length within the LSI chip cannot exceed 21 μm. In the case where it is necessary to exceed this length, a repeater circuit must be inserted. In reality also, wire length which is an issue in RC delay, also must be less that this value, and the global wires inside the LSI chip must be configured as a transmission circuit that can handle all harmonic waves.

Figure 1:
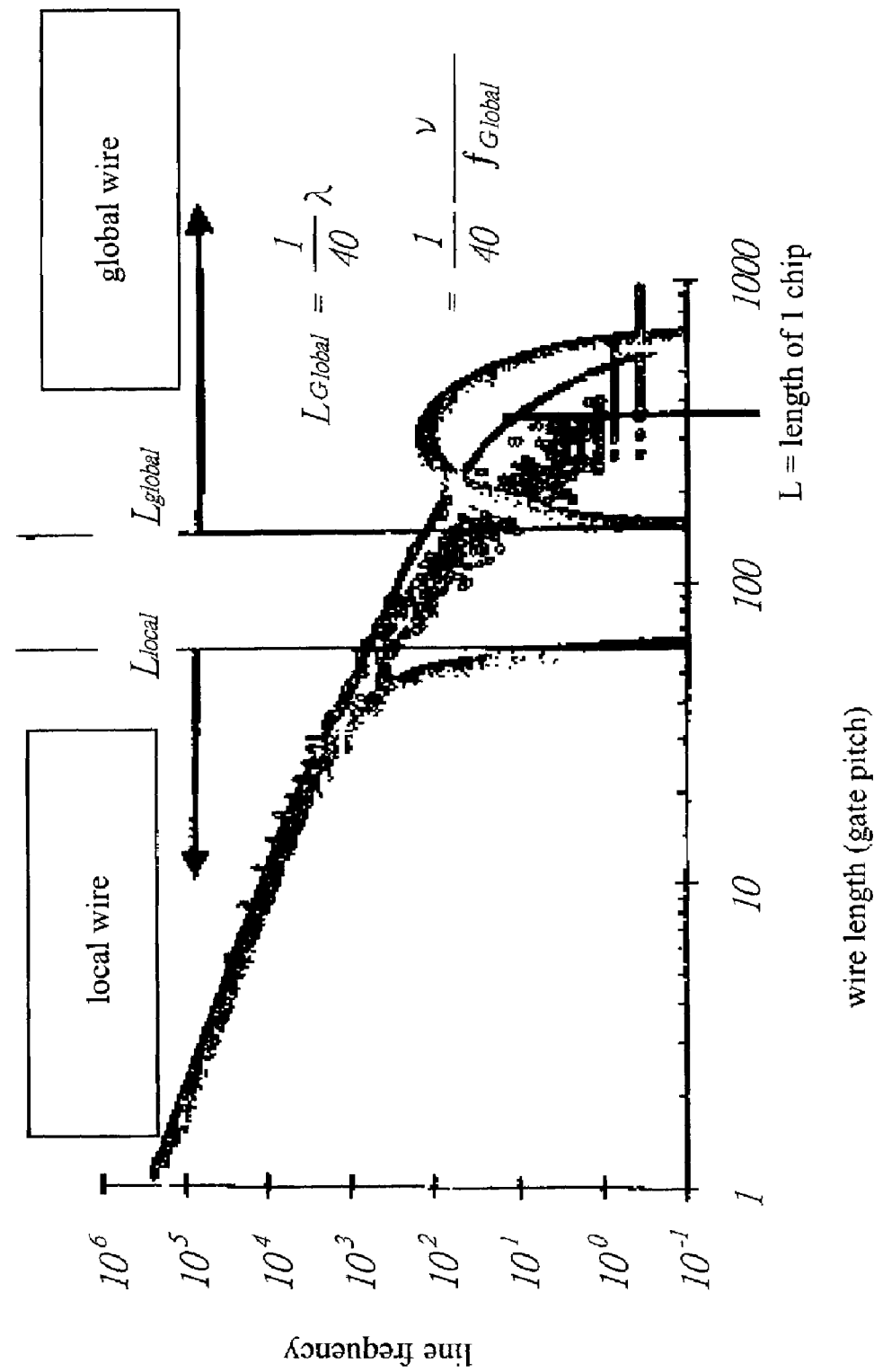
FIG. 1 shows wire length distribution of a general LSI of an embodiment of the present invention.

The general theory for LSI design is as in the wire length distribution shown in FIG. 1. FIG. 1 shows a general wire length distribution of LSI. (The Japan Society for the Promotion of Science, 151st Committee of 55th Conference on Limited Structure Electronic Properties, 165th Committee of 16th Conference on Integrated Device Systems, Jul. 19–20, 2000 Guidelines by MASU Kazuya of Tokyo Institute of Technology) The long wires are those called global wires which are between the LSI function blocks. As shown in FIG. 1, it is proposed that the portion that does not need to be a transmission wire (lumped parameter circuit portion), and the portion which has to be a transmission wire (distribution parameter circuit portion) are separated. Also, it is to be noted that the present invention is designed to be within the scope of this proposal. It is estimated that the circuit components in which long wires are required, are about 10% of the circuit components in LSIs, and ways to solve the problem of harmonic waves, that is the technical content of the present invention is described in the following.

In order to obtain the output signals of the pulse form of the driver, a switch and a power source are necessary. However in the case where within a very short space of time the state is changed from one in which there is no current flow to one in which the is a large current flow, the current transition gradient di/dt will become steep, voltage reduction of V=Ls (di/dt) occurs, and the power source Vdd experiences momentary reduction by the amount of v (Vdd-v). That the clocks frequency is raised one order of magnitude means that in the same wire structure, v is one order magnitude higher. The parasitic inductance Ls in the circuit is estimated to be 10 pH for a wire length of 10 μm. In the prior art, in a circuit in which 10 pH is considered desirable, in order to raise the circuit one order of magnitude, that is 1 pH, the wire length must be 1 μm. In order to maintain a 10 μm wire, the Ls must be made equal to 0.1 pH, or the current must be constant, but in lumped parameter circuit design, this is absolutely impossible. However, with distribution parameter circuit, this is possible. A concrete example will be considered here.

When the signal rise in the GHz band is less than tr=10 ps, in the conventional circuit, operation does not occur. The current switch type driver which uses the ECL circuit and which has already made historical impact was designed to eliminate this problem. However, this was not useful. The circuit in FIG. 2 is a bus switch circuit in which was designed with the 1 step of nMOS in place of ECL. FIG. 2 illustrates one example of a structure which connects a driver and a receiver. FIG. 2 shows the driver 1 and the receiver 2 which make substantially differential output possible. The driver 1 comprises: nMOS transistors Tn1 and Tn3, varactors Vn2 and Vn4, and resistors Re1 and Re2, and differential input output signals Vsignal and /Vsignal ("/" indicates inverse signals) are supplied from a flip flop. In addition, a bypass condenser Cb1 is connected to in common to another driver or the like. The driver 1 is connected respectively to the receiver 2 via the signal transmission wire 3 and to a power source Vdd via power source/ground transmission wire 4. Also the resistor Rt1 is connected to the input terminal of the receiver 2.

Usually, the prior step of the driver 1 has a latch and has a flip flop circuit. This circuit inevitably has a differential output terminal and thus the nMOS in which input signals to the driver 1 are complementary, and which is a circuit with varactors inserted as was shown in the proposed technology P9, can be designed relatively easily. In circuits having a large number of transistors disposed therein, the pn junction capacitance is increased by the amount of transistors. This not only causes increase in the flow of momentary current, but it also becomes necessary for this current to be discharged at the time the signals are switched and this causes a delay in the switching operation. The driver circuit which prevents this must be configured with the minimum number of transistors as shown in FIG. 2. The resistors Re1 and Re2 which are serially connected to these nMOS transistors Tn1 and Tn3 do not use diffused resistors which cause pn junction capacitance. Metal film resistors such as tungsten, molybdenum and silicides thereof are preferably used.

Figure 3:
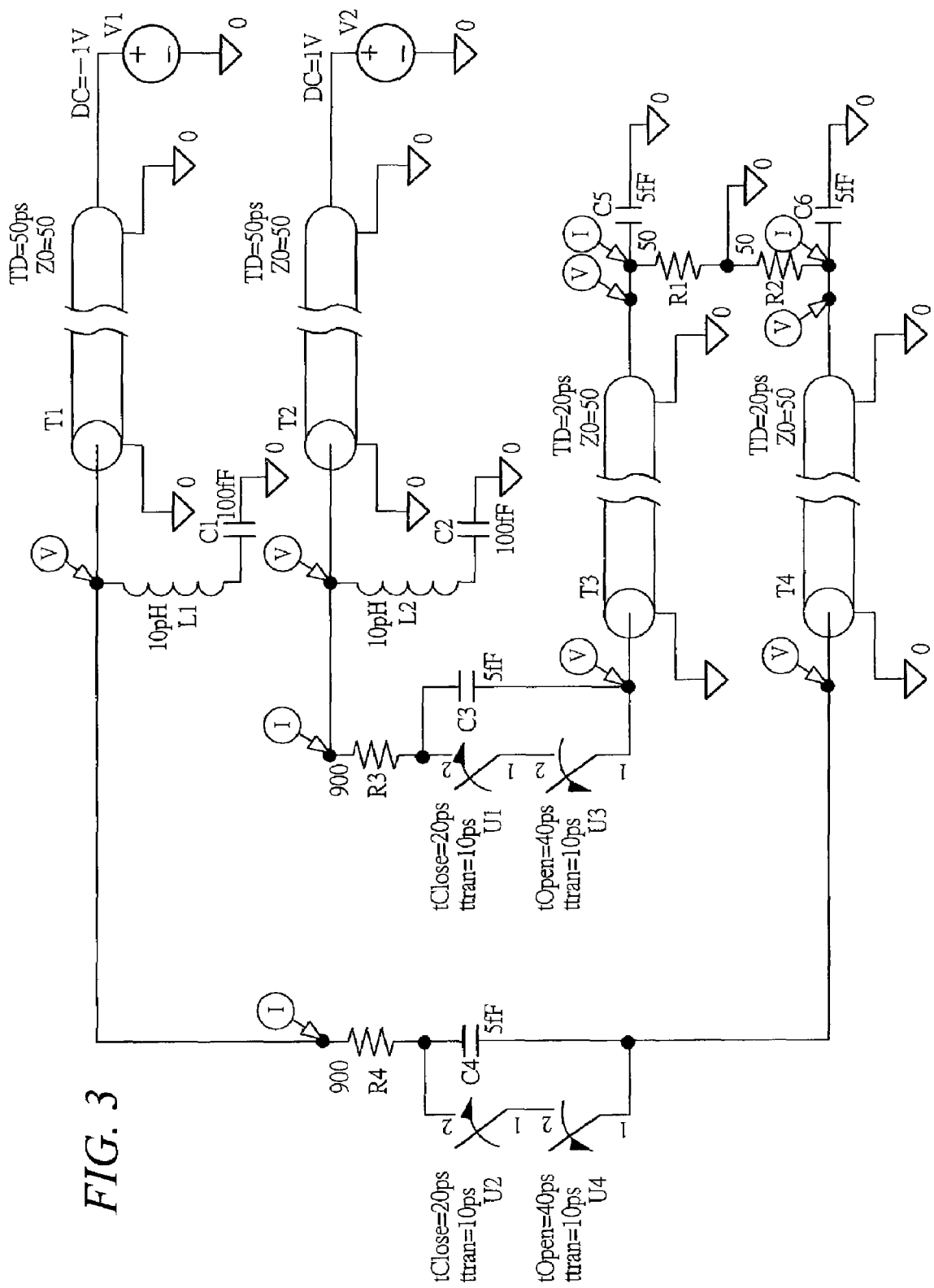
FIG. 3 shows a simulation model circuit equivalent to a 35 GHz block of an embodiment of the present invention.
Figure 4:
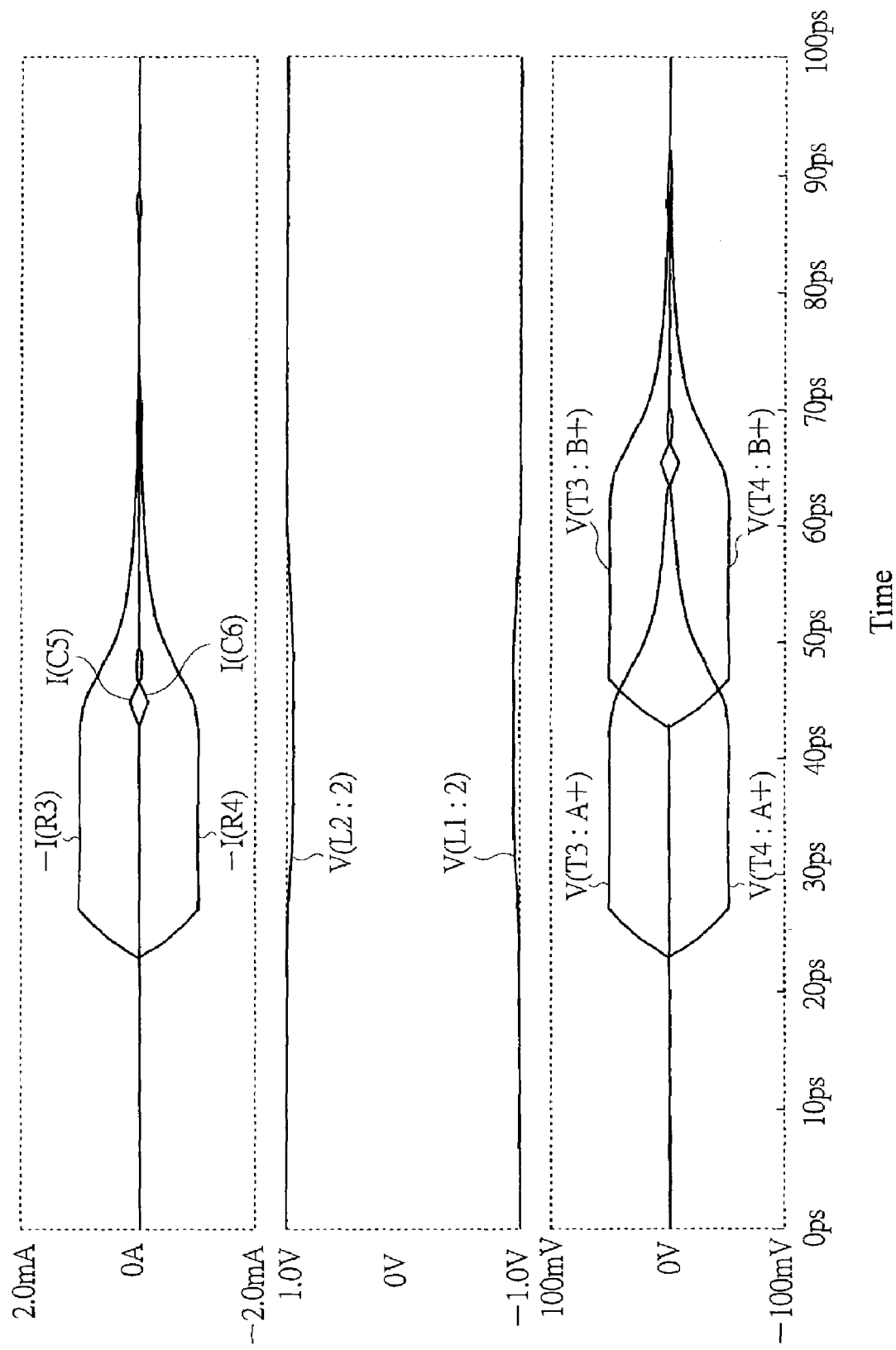
FIG. 4 shows the simulation results of the circuit in FIG. 3 of an embodiment of the present invention.

The usefulness of this circuit is confirmed by simulation. FIG. 3 is a simulation model circuit equivalent to a 35 GHz clock and FIG. 4 shows the respective results of the simulation (Upper step: current; middle step: power source voltage; lower end: signal waveform for sending terminal and ending terminal) of the circuit in FIG. 3.

FIG. 3 is the driver circuit of the present invention in which tr=tf=10 ps (equivalent to 35 GHz clock), and the power source voltage Vdd=2V and the transmission line voltage is set to 100 mV. In the simulator, ground is absolute ground and not the substantial differential circuit of FIG. 2. As a result, the design is such that the ground is raised. These simulation results are shown in FIG. 4. R3 and R4 add the current controlled resistance of 800Ω and the transistor on resistance of 100Ω. U1 and U2, and U3 and U4 show the switch operation of the differential transistors. The on resistance is 0.001Ω and the off resistance is 1 MΩ. In order to set the transistor parasitic capacitance, 5 fF C3 and C4 are both provided. The transmission lines T3 and T4 are set at a characteristic impedance of 100Ω (50Ω at each side) which is considered controllable and suitable within the LSI, and the line is surrounded with insulation of a dielectric constant ∈r=4, and a delay 20 ps which is equivalent to a 3 mm line length is set. When the lines are paired, the characteristic impedance is 100Ω, and because pairing cannot be done with the simulator, a coaxial cable is used.

Of course, the end terminal resistance of R1 and R2 is 100Ω, but in order to input this into the differential gate, gate capacity for the 5 fF of C5 and C6 respectively is added. The characteristic impedance of the power source/ground pair line of T1 and T2 are caused to have the same dimensions as the signal line and is set to 100Ω, and the bypass condensers C1 and C2 which are dispersed within the chip is made 100 fF. Here L1 and L2 are difficult to reduce because parasitic inductance of the bypass condenser causes them to be opposing electrodes, and this is a complexity that is characteristic of the current path. This is thus set to 10 pH. As shown in FIG. 2, the differential signal is handled in a single-ended manner. However, since these tools are not available in the simulation, 2 pairs of pair ground and transmission lines are shown.

The signal voltage amplitude is the extremely low value of 100 mV, but the potential difference is detectable by the differential input/output. A constant current always flows to the end terminal resistor of the transmission line. However the current has been reduced and is set such that takes low power consumption into consideration. With the setting, in the on state, it is 2 mA and the power consumption per driver is 100 μm (in the on state). This is a relatively high consumption power. However, the global line which is designed to have a limit of about 10% per LSI will inevitably become the guideline for design. However this is not considered a limiting factor in the present invention.

Even for this high frequency, constant current could be maintained in the simulation and there were little or no problems. The peak increase of the current aims at complementary characteristic with the switch characteristics in the open and close switch circuit, and the current indent goes over slightly due to the capacity at the receiving terminal. The varactor technology in the proposed technique P9 cannot be simulated, but it is expected that the rise and fall of the waveform would be steeper and smoother with this technology. This is a very important feature of the present invention. It is expected that because of being within the same well, it will be difficult for the characteristics to become unbalanced and thus the current will be flat.

This means that a circuit has been proposed which can operate at a pulse effective frequency of 35 GHz. The following points summarize the above-described based on FIG. 2.: (1) the differential driver is formed of a one stage transistor; (2) the power source transistor Tn1 and the varactor Vn2, and the transistor Tn3 and the varactor Vn4 respectively are within the same well structure and charge exchange for the entire transistor capacitance including the transistor diffusion capacitance can be carried out; (3) the power source/ground are pair transmission lines; (4) the differential signal is handled in a single-ended transmission line (FIG. 2), and it is not a differential structure with general ground as a reference, and as a rule, a ground is not disposed in the vicinity of the transmission line; (5) variable pair signals from the driver output terminal to the receiver input terminal do not contact the ground nor power source at any location whatsoever; (6) the matching end terminal has the same value as the characteristic impedance of the single-ended transmission line; (7) in the case where the differential driver is bipolar it is used as a base, and complementary use by the inverse signals of the lumped load is considered. This is the technology that the present invention proposes for the driver vicinity. These are the proposals derived from FIG. 2 and do not represent all the proposals of the present invention.

Figure 5:
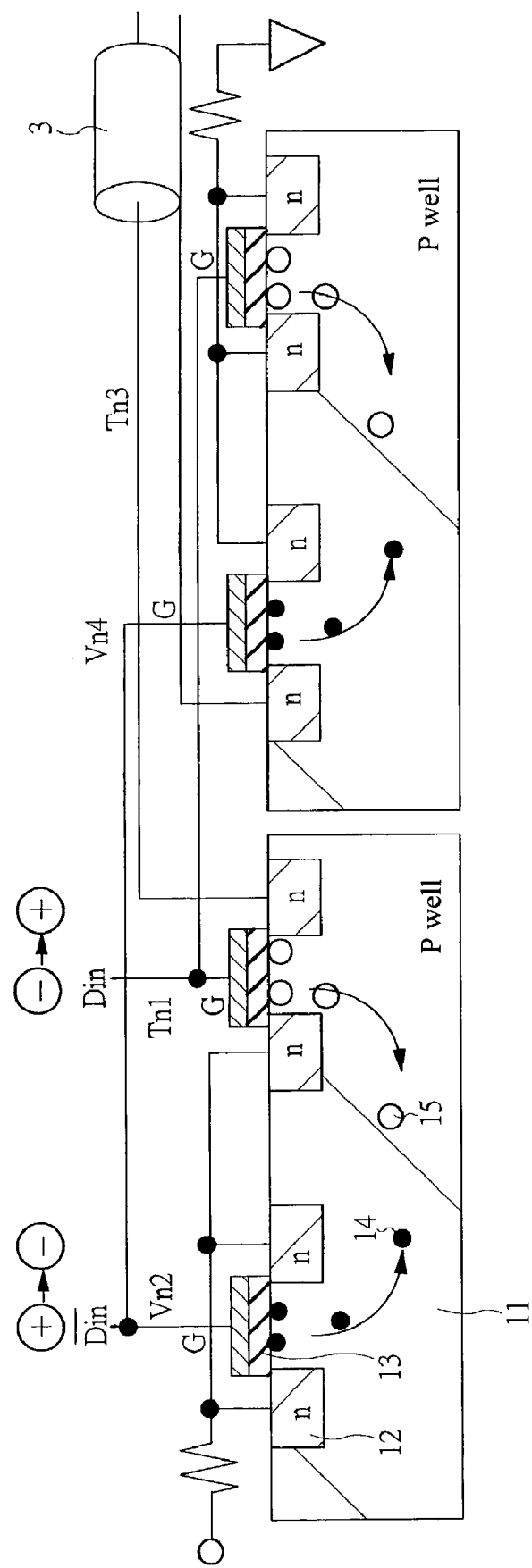
FIG. 5 shows an example of the cross-sectional structure of the nMOS driver in FIG. 2, of an embodiment of the present invention.

FIG. 5 is an example of the transistor which realizes the effects of point (2) described above. It shows one example of the cross-sectional structure of the driver of the nMOS structure in FIG. 2. The nMOS transistor Tn1 and the varactor Vn2 are located in the same P well 11 structure, and is formed from gate G which interposes the source and the drain which are connected to n diffusion regions 12, and the oxide film 13. In the same manner, the nMOS transistor Tn3 and the varactor Vn4 are located in the same P well 11 structure, and are formed from gate G which interposes the source and the drain which are connected to n diffusion regions 12, and the oxide film 13. The signal Din is input into the gates of the nMOS transistor Tn1 and Tn3, and the signal/Din is input into the gates of the varactor Vn2 and Vn4.

In this manner, the nMOS transistors Tn1 and Tn3 and the varactors Vn2 and Vn4 for the driver 1, are in the same well. The time when the channel load (In the nMOS, the electron 14 is a minority carrier, but the hole 15 is a majority carrier and thus cannot be considered a channel. However, the high hole density will be temporarily called a channel) drawn in by the respective gate electric potential is released due to the complementary signals, is the same time when the suction at the adjoining transistors is carried out, and thus high speed carrier exchange is carried out. Further, this contributes greatly to power saving due to load recycling.

Figure 6:
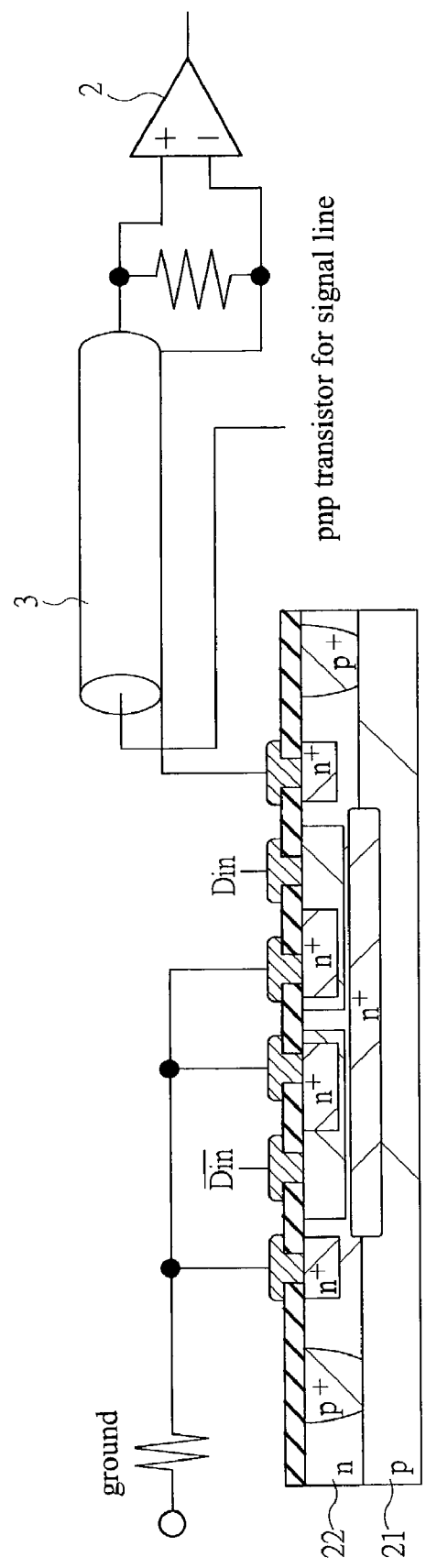
FIG. 6 shows the carrier reusable circuit of a bipolar transistor of an embodiment of the present invention.

When this is considered in terms of a bipolar transistor, the cross-sectional structure is as shown in FIG. 6. FIG. 6 shows a carrier recycling circuit for a bipolar transistor. It is to be noted that in FIG. 6, only the pnp transistor for the ground formed inside the well 22 structure which is on the p well 21 is shown, and the pnp transistor for the signal line has been omitted. In the carrier recycling circuit of the bipolar transistor, the pull towards the collector side of the base which is the lumped minority carrier is strengthened by the common collector current. Also, the complementary increase and decrease of the air depletion layer load is carried out in complement by a common collector. The pull of the emitter is the same as that of the prior art, so the effect in the MOS is small, but this structure makes great high speed operation possible, power use is reduced due to recycling.

Figure 7:
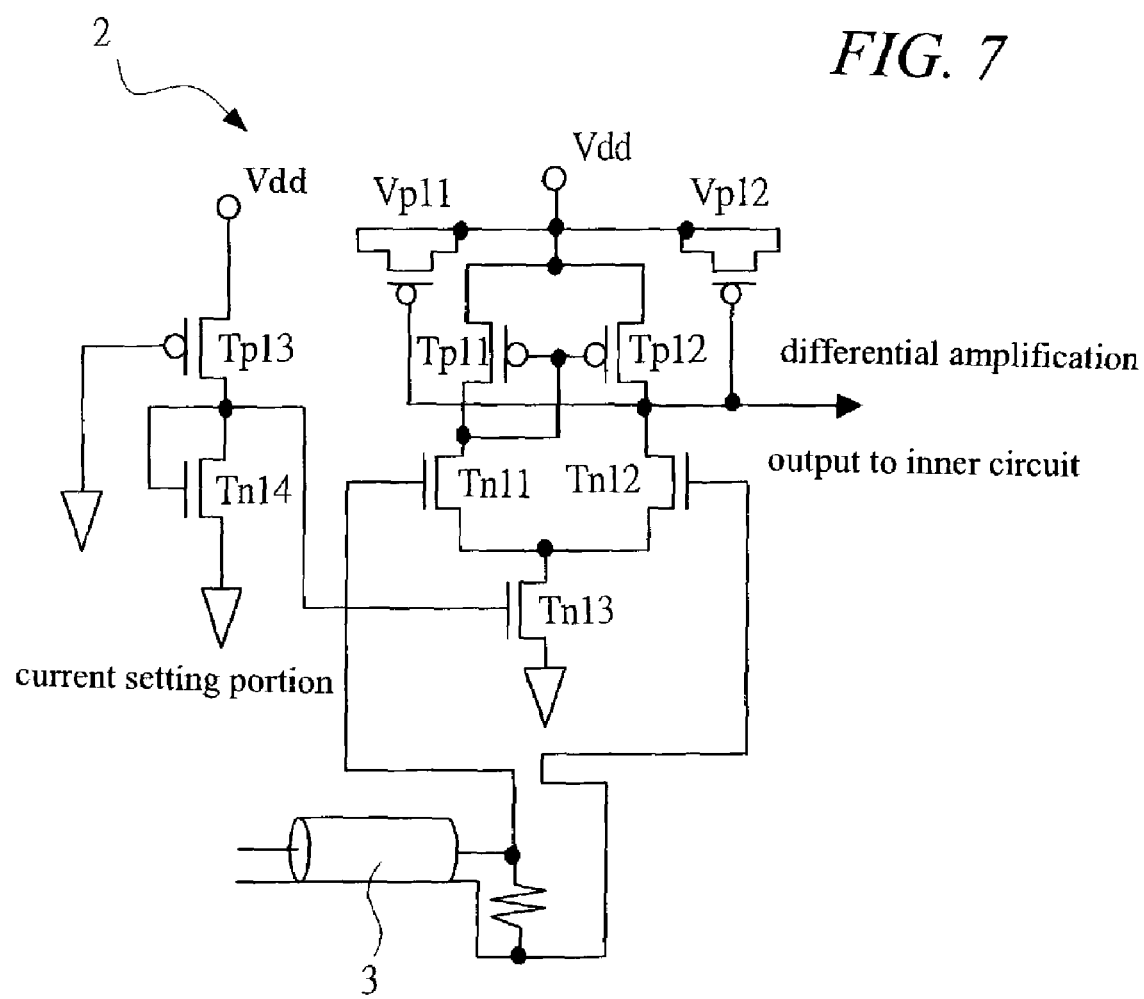
FIG. 7 shows an example of a receiver terminal of an embodiment of the present invention.

FIG. 7 shows an example of a receiver circuit. FIG. 7 shows an example of a circuit for a receiver terminal. The substantial differential input receiver 2 comprises a differential amplifier portion including: varactor Vp 11 and Vp 12, pMOs transistor Tp 11 and Tp 12, and nMOS transistors Tn 11 to Tn 13; and a current setting portion including: pMOS transistor Tp 13 and nMOS transistor Tn 14. Because the nMOS transistors Tn11 and Tn12 input inverse signal, they can operate with high speed when they have a common well structure and a common collector structure (in the case where a bipolar transistor is used) as is shown in FIG. 5 and FIG. 6. Because the nMOS transistors Tn13 and Tn 14, and the pMOS transistor Tp 13 are stacked transistors, it is sufficient for them to have the conventional circuits. It is sufficient for the varactors Vp 11 and Vp 12 to be set in the same manner as FIG. 2, and as shown in FIG. 5 using the inverse operation of the nMOS transistors Tn11 and Tn 12. In this manner, high speed operation and power saving becomes possible. The pMOS transistor Tp 11, the varactor Vp 11, the pMOS transistor Tp12 and the varactor Vp 12 must be within the same well structure.

Figure 8:
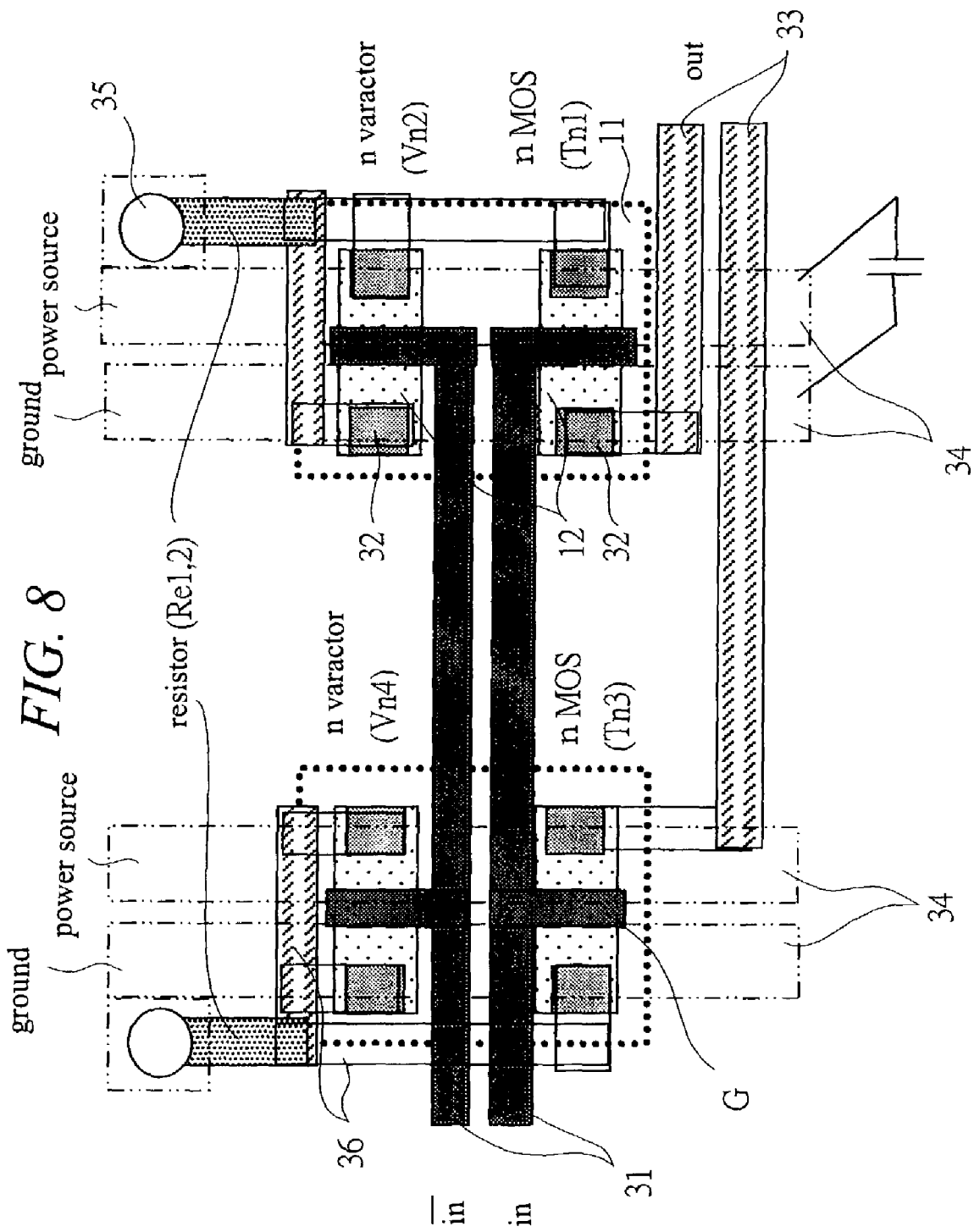
FIG. 8 shows an example of the planar structure of a driver of an embodiment of the present invention.

Next, FIG. 8 shows the wire structure. FIG. 8 shows an example of the planar structure of a driver. As in FIG. 2, the driver comprises 2 nMOS transistors (Tn13 and Tn 14), and 2 varactors (Vn2 and Vn 4) and they are in the P well 11 structure. The gate G is connected to the pair transmission lines 31 for input-signals, and the n diffusion region 12 of the source and the drain are connected to lines which link the power source/ground and the output signal transmission lines 33, via the connector 32. The power source/ground transmission lines 34 are connected via the resistors (Re1 and Re2) by the contact 35 to the layer directly above.

Thus an important feature of the design is that the input signal lines are also the pair transmission wires 31, the output signal lines are also the transmission lines 33, and the power source/ground pair is also the transmission line 34 (upper layer) and in the case where pairing cannot be carried out geometrically, the wire alone may be a stand-alone wire 36. The length of this stand alone wire 36 is equal to or shorter that 1 gate pitch in FIG. 8, and this type of wire connection is within the scope of the proposed technique. Another important point is that the transistors which are paired for differential input are within the same well structure. Here all the transmission lines are pair co-planar lines.

Figure 9:
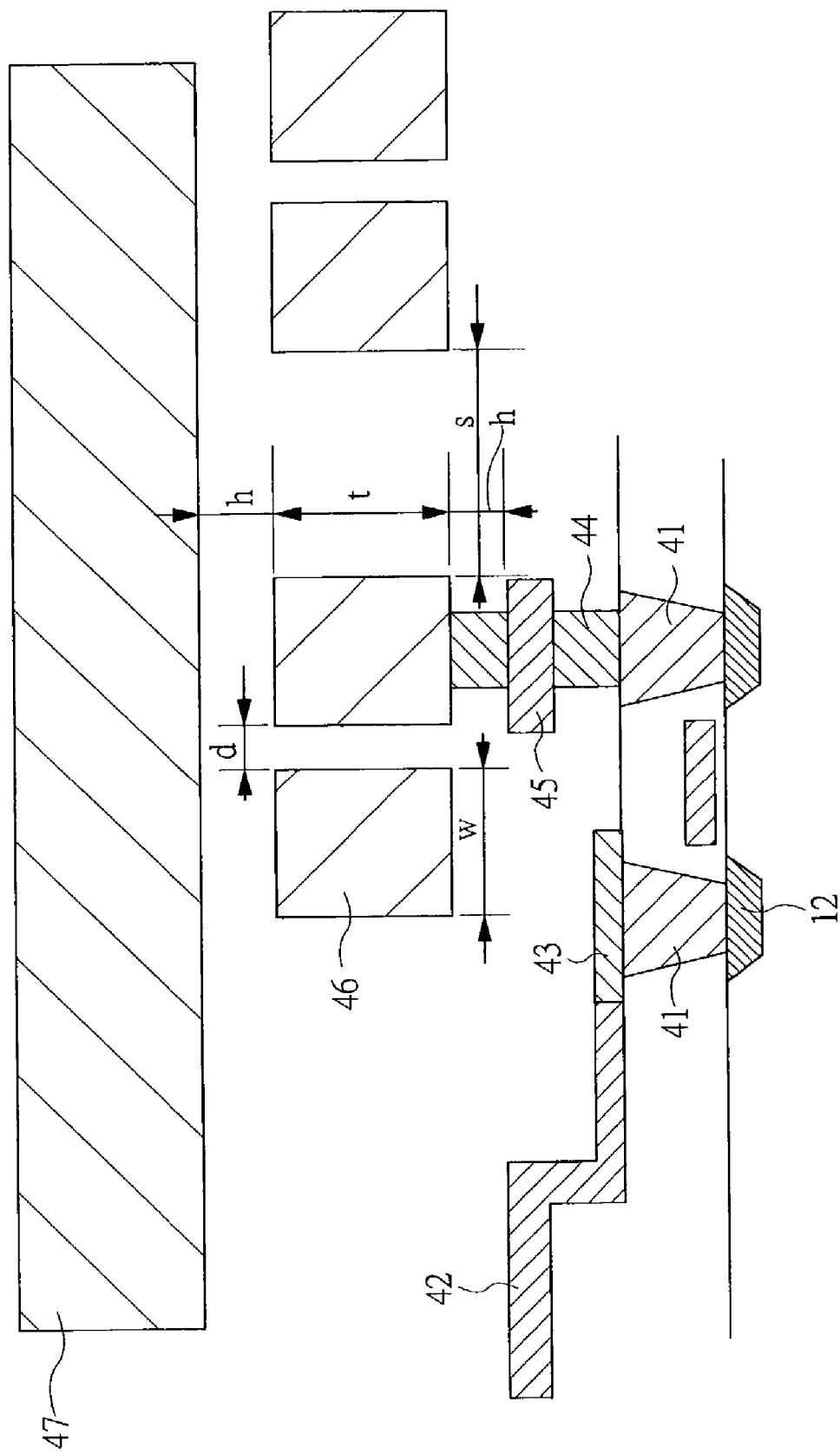
FIG. 9 shows an example of the cross-section structure of a transmitter portion of a driver of an embodiment of the present invention.

As shown by the 2-dot chain lines, the power source/ground layer, are assembled as pair coplanar lines along respective transistor arrays in the third layer. In order to make this clear, a cross-sectional structure is shown in FIG. 9. FIG. 9 shows an example of a cross-section of the transistor portion of the driver (the cross-section of the insulation layer has been omitted). On one side the n-diffusion region 12 of the transistor is connected to the contact wire 43 which contacts the upper layer wire layer 42, via the plug 41. On the other side it is connected to the upper power source/ground pair layer 46 via the plug 41, the via-holes 44, the column 45 and the like. Also, just above the upper power source/ground pair layer 46, power source/ground uppermost layer 47 is disposed. It is to be noted that each of these conductor portions and conductor layers are surrounded by an insulation layer.

The same dimensional conditions of the proposed technique P12 are proposed here. First, the cross-section of the coplanar-line of the upper power source/ground pair layer 46 will be examined. In order to strengthen the coupling of the power source/ground, an aspect ratio of $t/w \geqq 1.5$ is preferable. This is because, by increasing the opposing surface, the coupling of the power source/ground is strengthened so as to reduce leakage to the outer portion of the electromagnetic field. Next, it is also necessary to satisfy the condition d<h. This prevents, as far as possible, the fringe of the opposing surface electromagnetic field from crossing the layers and intersecting. That is, this is for preventing cross talk. Third, the relationship between s and d must be such that $s/d \geqq 1.5$. This is also for avoiding the effects of the fringe. This should be realized for all the pair co-planar lines (signal lines and clock lines). All the logic and memory transmission lines for LSI that operate at a clock frequency above a few GHz, and of course, the driver 1 and the receiver 2 too, preferably have this structure. Of course, it is needless to say that it is preferable that these wiring rules are applied to all chip global wires.

The present invention also proposes that, concerning the output of the driver 1, in the course via the main line bus to reach the terminal end resistor, the ground level pair line does not contact the common ground at any location, and exists as an independent ground line. As a result, the ground level carries out complementary switching with the pair signal lines, and the differential amplifier receiver 2 is able to achieve effective maximum amplitude. A further result is that disturbance of the electromagnetic field is minimized, and thus the waveform is smooth and also a circuit is obtained in which the parasitic inductance and parasitic capacitance is minimized.

FIG. 10 shows the structure of this transmission line. It shows an example of a suitable transmission line. FIG. 10A shows the pair coplanar line; FIG. 10B shows the guard coplanar line (both terminals common); FIG. 10C shows the stacked pair line; and FIG. 10D shows the guard stacked pair line (top and bottom common). In FIGS. 10A to 10D, 2 pairs of the transmission line 51 are in each of the insulation layers 52. However, it is a rule for pair coplanar and stacked pairs, that the distance between adjoining pair lines is a space of more than twice the space of the pair line itself. The guard coplanar line and the guard stacked pair line are designed to have a space between adjoining wires which exceeds the space of the pair line itself. These limits are within the scope of the proposals of the present invention. The advantages of lines with guards are not within this scope, but decreasing of the impedance of the transmission line and suitable design can be included. In order to meet the conditions of TEM wave transmission, the transmission line 51 must be insulated by the insulation layer 52 formed of a homogenous material. The extent of this layer for the pair coplanar and stacked pair is the width 2*s* from the outer periphery of the conductor, and for the guard coplanar and the stacked pair is the width s according to the proposals of the present invention.

FIG. 11 proposes an insulation layer 52 for the case where the insulation layer cannot be designed so as to have this width. FIG. 11 is an example which shows the matching of the effective dielectric constant of the insulation layer at the periphery of the conductor in an uneven insulation layer. An example of a stacked pair line is shown in FIG. 11. This is the uppermost layer of the solder resist 53 portion at the printed wire-board. Because the solder resist 53 portion is thin (thinner than 2s), in order to stretch the electric power line which extends in the upper portion the air layer portion, the effective dielectric constant of the solder resist 53 is reduced. In the case where the effective dielectric constant of the lower insulation layer 52 is made "a", in order to make the effective dielectric constant of the solder resist layer 53 the same "a", the present invention proposes structure for increasing the dielectric constant of the solder resist 53. As a result, the transmission line 51 can substantially maintain the TEM wave mode. When there are different types of insulation layer and air layers within the 2s range of the pair co-planar and stacked pair, effective dielectric constant is within the range of effective field and they are adjusted to have the same dielectric constant. This is within the scope of general technology. The guard coplanar and the guard stacked pair lines are designed to follow the same rules for the range of the width s.

Next, as shown in FIGS. 12A and 12B, consideration is given to the length of impedance mismatching of the column, the via-holes and the like. FIGS. 12A and 12B show an example of a model the length of impedance mismatching of the column, the via-holes and the like. FIG. 12A shows the state in which the space between the line 61 and the line 62 is connected by the column 63 and the via-holes 64. FIG. 12B shows the output waveform with respect to the input waveform ($1^{st}$–$4^{th}$ order and $1^{st}$–$2^{nd}$ order). When the dielectric constant within the chip is set to be 3, the electromagnetic transmission rate will be $1.73 \times 10^8$ [m/s], and the transmission delay for a line length of 100 μm is 0.578 ps. Because the time for raising the pulse of the main line is temporarily set to 10 ps, the phenomenon can be interpreted in the following manner. Even if energy is caused to flow into the mismatch portion, the return is 0.578×2=1.156 ps, and 8.5 cycles are possible within 10 ps. By adjusting the cycles, a stable region can be reached within the rise time. Accordingly, there is waveform distortion during the rise. But subsequently, after the stable waveform passes the mismatched portion, the line advances.

As shown in FIG. 13, this is looked at in terms of energy. FIG. 13 shows an example of mismatch impedance and multidimensional reflection/reflection energy and penetration rate using 50Ω as a reference. 90% of the energy when the time required for 3 cycles (1–4 dimensions) has elapsed, is penetrated even when mismatch is 50Ω/200Ω. Accordingly, this length can be disregarded. That is, tr>7+pd is the extent according to the proposals of the present invention.

In FIG. 2, the current of the power source/ground pair line is complementary. The power source current is a circuit that goes on/off with respect to the signal going on/off. The bypass condenser required a varactor and the like which is equivalent to this circuit, but next, a driver will be proposed in which current flow in a power source/ground pair line. This is shown in FIG. 14. FIG. 14 shows an example of a differential type driver. The driver 1a in FIG. 14 is an example of a current switch, and includes nMOS transistors Tn21, Tn22, Tn23, Tn24, and resistor Re21, and flows a constant current for the input/output signals Vsignal and /Vsignal. When the duty times are the same at on/off, electric power consumption will be twice that of FIG. 2. Because the current is constant, the bypass condenser Cb21 cannot handle the transistor capacitance and the through-current.

With respect to transistor capacity, the nMOS transistors Tn21, Tn22, Tn23, Tn24 operate complementarily and thus this may be used as a complementary varactor, and it is not necessary to provide a varactor as is the case in FIG. 2. Here, when transistors of the same type that operate complementarily are close together, by disposing them in the same well, the same effects of the complementary varactor are obtained and this structure is within the scope of the general proposals of the present invention. As a result of this effect, the role of the bypass condenser Cb 21 is reduced and it is sufficient for it to just handle only the through-current at the time of switching.

The drain voltage of the nMOS transistors Tn21 and Tn22, and the drain voltage of the nMOS transistors Tn23 and Tn24 differ because they are in upper and lower levels and thus the on-resistance too differs. However, when each of the nMOS transistors Tn23, Tn24 are on, the drain voltage and the source voltage are approximately equal to zero. This is because the signal energy (load amount) proceeds towards the negative load resistance Rt21 of the receiver 2 as electromagnetic waves and as long as there is no reflection, they do not return. Accordingly, it is sufficient for the nMOS transistors Tn23, Tn24 to have the effect of absorbing the reflection energy and they may also be different from the nMOS transistors Tn21 and Tn22. Preferably, they have the same on-impedance as the characteristic impedance the signal transmission line. Of course, since the transistor size increases this is not necessarily advantageous.

Needless to say, even in the case where the nMOS transistors Tn21 and Tn22 are replaced by pMOS transistors, the principle of FIG. 14 can be applied to. However, because pMOS transistors are slower than nMOS transistors and they require a large area, a configuration comprising only nMOS transistors as shown in FIG. 14 is advantageous.

The advantage of the driver 1 will be reviewed once again with respect to the differential type driver 1a of FIG. 14 as described in FIG. 2. FIG. 2 has the disadvantage that a steep step current is flowed, but electrical power can be saved to the extent that the device is off. Actually, the steep step current is the same as the penetration current di/dt of FIG. 14, and the performance of the bypass capacitor and the necessity thereof is the same. In order to recharge this discharged bypass capacitor as quickly as possible, another measure mentioned in the beginning, which is characteristic impedance, must be reduced. This is because the discharge resumes at 1-exp ($t/Z_oC$). Here $Z_o$ represents the characteristic impedance of the power source/ground pair line, t represents time and C represents bypass capacitor.

Even in the circuit of FIG. 14, when the characteristic impedance of the transmission line 4 of power source/ ground pair is not less than the load impedance, the voltage will be reduced due to Law of Ohm. Accordingly, in both the structures of FIG. 14 and FIG. 2, the following condition is met: (characteristic impedance of power source voltage pair line)<(characteristic impedance of the signal line). FIG. 4 is the result of an equal time simulation, and it shows a 5% drop in power source voltage. When the characteristic impedance of power source/ground pair line is $Z_{OP}$ and the driver set which suspend from these is set to n, the following relationship must be satisfied:

$$Z_{OP} < Z_O/n$$

There is however a problem when there is parasitic inductance in the power source/ground transmission line 4. The circuit conditions of FIG. 3 is 0 H, but when the conditions were made 50 pH, the step current is 10 ps at 2 mA, and a 10% power source drop v in the signal amplitude=100 mV, then using the calculation:

$$V = L \times di/dt = 0.05\ nH \times 2\ mA/10\ ps = 10\ mV$$

It becomes less than or equal to 0.05 nH. In the structure of FIG. 8, because conditions of the power source/ground pair are all the way up to the area immediately close to the driver, conditions of 50 pH or less are met.

When this design is not possible, the bypass condenser must compensate. The parasitic inductance cannot exceed 50 pH, but this cannot be achieved a high capacitance condenser which has complex current circuits. The necessary capacity will be calculated.

This is carried out under the conditions of FIG. 3. A time current tpd for charging a load Q is flowed on signal transmission line having a length of 3 mm, and under the conditions of FIG. 3, it is 20 ps. Because the load has 10 fF, it is necessary that:

$$Q = 2\ mA \times 20\ ps + 10\ fF \times 10\ mV = 40.1\ fC$$

It is to be noted that the varactor compensates for the junction capacitance of the driver so a count is not necessary here. Because of conditions that allow a 10% voltage drop for a power source voltage of 1V and a signal amplitude of 100 mV, it becomes:

$$40.1\ fC \times 10 \times n/30\ mV = 134\ fF \times n,$$

and even when n is 1 byte the capacity is only the small capacity of 1.1 nF, and even when n=a few units, the condition of a parasitic inductance of 100 ph can be met. Accordingly, this can be explained by the characteristic impedance for the power source/ground pair line or the bypass capacitor, or by both. However, because the tpd is increased by a large amount in wires with long package transfer, only the condition of decreasing characteristic impedance of the power source/ground pair line applies to this circuit.

A method for keeping the current constant in FIG. 2, is proposed in FIG. 15. FIG. 15 is an example of a bus switch type driver with constant current. The driver 1b comprises nMOS transistors Tn31, Tn32, Tn33 and Tn34, and resistors Re31 and Re32, and input/output signals Vsignal,/Vsignal are input. When the bus transistor is on, the nMOS transistors Tn33 and Tn34 conduct via the resistor Rt 31, and the current viewed from the power source/ground meets the condition of being constant. The nMOS transistors Tn31 and Tn33 and the nMOS transistors Tn32 and Tn34 respectively are within the same well structure and they recycle the load. This is different from FIG. 2 in that, because complementary current of the power source/ground pair transmission line 4 is ensured, when the condition $Z_{OP} < Z_Q/n$ is ensured, then the bypass condenser cb31 becomes unnecessary. That is to say, twice the amount of power is consumed, but it is still a more ideal circuit than that of FIG. 2. The advantage of the circuits of FIGS. 2 and 15 is that one side of the transmission line is at ground level and thus handling of the circuit is simple. That is, it can be the handling of single-end waveform (In fact, this is also great differential transmission in terms of signal transmission). However, the dropping to the ground at the end terminal side cannot occur. This point is an important concept for the present invention.

A D-type flip-flop is shown in FIGS. 16A and 16B as a final example of a circuit. FIGS. 16A and 16B show an example of a D-type high-speed flip-flop circuit. FIG. 16A shows a flip-flop circuit while FIG. 16B shows an inverter. This is an inverter circuit is a D-type flip-flop circuit which has an inverter which synchronizes by a clock, and the nMOS transistors Tn41 which are driven by the clock CLK, comprise the pMOS transistors Tp42, Tp44, Tp46 and Tp48; and the nMOS transistors Tn43, Tn45, Tn47 and Tn 49 which form the inverter. More concretely, the inverter has a structure such as that shown in FIG. 16B, which has respective diode type varactors, Vd 41 and Vd42. In order that the number of logic steps is equal, only the output portion Dout has a buffer rather than an inverter structure. A p-type substrate is difficult to fabricate, but an i-type substrate SOI structure can be fabricated with no problems.

FIG. 17 illustrates the diode varactor structure and the principle for operation. FIG. 17 shows an example of CMOS structure having a diode varactor, and the load movement thereof. In FIG. 17, a pMOS transistor and one of the diodes (Vd41) which are formed together in the n well 71 structure, comprise a $n^+$ diffusion region 72 and a p diffusion region 73, and a depletion layer 74 is formed is along the periphery of the p diffusion region 73. The other diode(Vd42) formed along with the nMOS transistor in the p well 75 structure comprise a $p^+$ diffusion region 76 and a n diffusion region 77, and a depletion layer 78 is formed is along the periphery of the n diffusion region 77. In an SOI, a diode are disposed in the p well and n well respectively and the junction capacitance of the diode, can be complementarily recycled as the lumped load.

The global wire of FIG. 1 is a circuit which handles the signal with the bus being the main entity. In the description above, the circuit system, that is the path that extends across the latch (flip-flop), driver, receiver, latch (flip-flop) was generally outlined. The signal system is one in which differential signal is separated from the common ground by a body. When a ratio with respect to LSI chip of the circuit is approximately 10%, the electric power consumption has no problem. But, the present invention does not set percentage limits. However, the electric power consumption in the lumped parameter circuit portion, and the gate delay, and also RC delay cannot be disregarded. By providing a recycling means for all of the accumulated load of all of the DRAM, SRAM, and logic gate as shown in FIG. 17, it becomes more advantageous than increase of the number of transistors. Accordingly, providing necessary load recycling means for all the circuits is a feature within the scope of the proposals of the present invention.

The devices and circuit portions of the driver-receiver transmission system was described in the above.

2. System Structure

Next, the structural components of the system which corresponds to these objectives will be described. First, an ideal configuration considering wirings between chips is an equal length parallel wiring structure. This is shown in FIG. 18. FIGS. 18A and 18B show an example of the connection structure of the transmission wires connecting the chips. FIG. 18A shows planar view through the chip, and FIG. 18B shows a cross-sectional view taken along line b–b' of FIG. 18A. Basically, there is a pad-to-pad connection between the chip 101 and the chip 102 and it is a one way line. The receiver end has a terminal end resistor 103 connected thereto and may be inside or outside of the chip. That is, it is a matching terminal. Only the pad-to-pad transmission lines are shown, but it is needless to say that there are like those shown in FIG. 5.

The transmission line structure within the chip is preferably coplanar. However, cross-sectional structure with a long length and a high aspect ratio, cannot have this structure at the package and printed wire-board, and thus a stacked pair line is the preferable line structure. As shown in FIG. 18A a transparent view of the chip shows that the wire board 106 is connected here by a flip chip from the driver 104 to the chip pad 105 via the coplanar lines. The transmission lines 107 which are beneath the pad width and power source/ground line 108 are connected respectively to the lower layer at the via-holes under the flip chip pad. They are also provided so as to have the minimum overlap distance, and the cross-sectional structure is as shown in FIG. 18B.

In order to prevent upward and downward shifting in the stack, and to prevent leaking of the electromagnetic field, the lower layer of the pair preferably has a width which is 1.2–1.5 times wider than the line width w. As stated before, the relationship between the stack pair and the line width must be w>5, (d+t)≦s/2, d≦2$h_1$, d≦2$h_2$. The receiver pad 109 is provided at an equivalent position from the driver 104 and the receiver 110 is connected thereto. This short wire too is preferably a stacked pair line when it is inside the package, and a coplanar line when it is inside the chip. As can be seen from the cross-sectional structure, direct lines such as power source/ground line 108 and the like are provided beneath the stacked pair lines of the signal transmission line 107. A bypass condenser 111 is provided at the periphery of the driver 104 as was stated before.

In this type of structure, because of the pad array of driver chip and the receiver chip, the conditions shown become necessary as shown in FIG. 19. FIG. 19 shows an example of the limiting conditions of the chip pad array. In FIG. 19, the controller chip 121 and the memory chip 122 are connected from each of the chip pad 123 and 124 via a bus line 125.

(1) The stacked pair lines must be formed with a pitch that is twice the pitch of the chip pad, and the pad must be aligned linearly in the direction of the bus line. (2) The signal line is taken out from the one row of chip pads and limiting conditions when coupling with other portions is carried out are increased. These two restrictions pose a big problem for the designers. When the chip area is shrunk as a result of improvements, the pad pitch also has to be shrunk. Even when the wire pitch is shrunk due to technological improvements of the printed wire-board, the chip pad pitch must also be shrunk in a similar manner. Because the timing of improvements of the driver (controller) chip and the memory chip differ, it is difficult to come up with conditions that apply to both. The shrinking of the pad chip requires improvement of bonding technology which affects reliability most, but this is complex.

For this reason, an LSI package is used as an interposer, and the problem is solved to some extent. A branched wire line length extension, or the fan-out type line structure like that of FIG. 20 allows this. FIG. 20 shows an example of a fan-out wire structure when a package is used. In FIG. 20, the package 133 having the controller chip 132 mounted therein, and the package 135 having the memory chip 134 mounted therein are connected via the bus line 136 on the printed wire-board 131. In each of the packages 133 and 135, the chip pads 137 and 140 and the package pad 138 and 141 are connected via the fan-out wires 139 and 142.

Even if structural design is carried out such that the wire extension is kept within the limited range, the principle of the same wire-length does not apply to the fan out structure and this causes a problem when there is synchronous incoming signals. In the case where the wire width of the fan-out wires 139 and 142 is increased, there is the problem that the characteristic impedance changes. The present invention proposes a structure for solving this problem.

In the FIG. 20 elements are not shown as stacked pair lines for the sake of convenience, but the fan-out structure in the package and the wires on the printed wire-board are stacked pair lines. The line dimensions of the printed wire-board 131 can be such that it is thicker than the fan out wires 139 and 142. However, by adjusting the angle of fan out, this dimension can be freely set. That is to say, use of the package in order that the pitch of the chip pads 137 and 140 can be independently set, is a concept that is mainstream in the existing technology. In high speed signal systems however, it is desired that the characteristic impedance and the wire length is the same for all of the lines. This item is the same as in the proposed technology P12.

A characteristic impedance of 28Ω will be used as a reference. The characteristic impedance within the chip of 100Ω has been achieved, but in this case, in order to illustrate that 100Ω design is simple, and that in the worst case this design is possible, 28Ω was selected. If w=200 μm and εr=4.5, from the approximate formula for characteristic impedance of the stacked pair line (Harald A. Wheeler) (refer to symbols in FIG. 18):

$$Zo=(377/(\epsilon r)^{1/2}\{(w/d)+(1/\pi)ln(4)+((\epsilon r+1)/2\pi\epsilon r)ln(\pi\epsilon r (w/d)+0.94)/2+\{((\epsilon r-1)/2\pi\epsilon r^2)ln(\epsilon r^2 16)\}^{-1}[\Omega], \quad \text{(Formula 1)}$$

requires that d=39 μm. Although, there is a branched pad here, the bus structure is the same all the way to the end terminal, and there is no need to be concerned about mismatching of the characteristic impedance. In the case where parallel wires of the same length is assumed, the pad pitch is such that w/2=100 μm, and can be designed using current technology. If the thickness of $h_2$ is made 60 μm which is the standard for the pre-impregnation of a printed wire-board, then this will be an ideal layer structure.

Meanwhile, the package wire needs to be designed in accordance with the pitch of the chip pads 137 and 140. In this case the pitch of the chip pads 137 and 140 is 50 μm, and w for the stacked pair wire on the package is 100 μm. According to the above formula, d=19.5 μm. In this case the transmission line design is such that there is 28Ω between the chip pads 137 and 140, and the end terminal resistor. However, because the line lengths of the fan-out wires 139 and 142 are different, design such as shown in FIG. 21 is carried out. FIG. 21 is an example of equal-length fan out wires.

A meandering zigzag wire is often used as a known example of equal-length wires for fan-out wires, however because of problems with transmission with respect to the magnetic field due to the adjacent effect, the layout is like that of FIG. 21 in which equal-length arcs are used. That is to say, by designing the fan out wire 139 (142) which connects the chip pad 137 (140) and the package pad 138 (141) to be arc-shaped, and because the wires are of equal length, smooth transition can be expected because there is no bending and curving reflection as in the meander type. In addition, since the distance between adjacent wires can be comparatively large, this arrangement is advantageous in terms of cross talk.

A calculation formula for designing in a geometrical arc, results in the following in accordance with FIG. 22. FIG. 22 shows an example of a model for fixing arc AB and varying chord AB. Chord AB=$l_1$ is the straight line distance between the outermost pads. This is a variable, and is function for determining the radius OP and which makes the arc AB a constant. If segment $PC=r_1-h_1$ and $Co=h_1$, then $(l_1/2)^2 = r_1^2 \cdot h_1^2$ can be obtained and from $\theta_1/2=\tan^{-1}(l_1/2h_1)$, arc $AB=r_1\theta_1$ (radian) can be obtained. If $h_1$ is suitably determined using these formulae, $r_1$ can be determined. If arc AB is set at Arc $AB=r_1\theta_1$, $h_x$ and $r_x$ can be determined for the distance $l_x$ between subsequent pads.

$$\text{Arc } AB(\text{constant})=(rx^{2-}(1x/2)^2)^{1/2} \cdot \tan^{-1}(1x/2)(rx^{2-}(1x/2)^2)^{1/2} \quad \text{(Formula 2)}$$

Of course the arc AB may have an elliptical shape or that of a suitably selected high-order curve (FIG. 21). It is a proposal of the present invention that the curve thereof is not steep.

A structure in which a package is used has been presented in the above. However, recently a design method is often used in which the package is being omitted, and the chip is connected directly on the printed wire-board, and after running the fan-out wire, parallel bus lines are run. However, fabrication on the same substrate so as to vary the pair line distance d in accordance with the line width w would be difficult. Even if this could be fabricated, the cost would be extremely high and the reliability with which the step portion is connected would be reduced.

The next proposal is a structure in which the pair line distance d is fixed and line width w is varied. This is shown in FIG. 23. FIG. 23 shows an example of a line structure in which the distance between the pair lines is fixed and the line width is varied. As shown in FIG. 23, a structure is proposed in which the portion of the fan-out structure which connects the chip pad 151 and the package pad 152 is formed as the microstrip line 153 (or a strip line), and parallel bus lines are used specifically as a stacked pair line 154. It is to be noted that the other end portion of the microstrip line 153 is a beta ground 155, and in another example, a branched electrode 156 is provided at the stacked pair line 154.

The microstrip line (strip line) 153 causes an electric field with respect to ground, and thus the capacitance $C_o$ per unit length is increased. As a result, $$Z_0=(L_o/C_o)^{1/2} \quad \text{(Formula 3)}$$

decreases when the line width w is the same. When $Z_o$ is fixed, w can be made smaller. The approximate formula for the microstrip line 153 (Harald A. Wheeler) (refer to symbols in FIG. 18) is:

$$Z_0=(377/2.828\pi(\epsilon r)^{1/2}+l)ln\{1+(4d/w[((14+8/\epsilon r)/11)(4d/w+(((14+8/\epsilon r)/11)^2(4h/w)^2+\pi^2(1+1/\epsilon r)/2))^{1/2})[\Omega] \quad \text{(Formula 4)}$$

When $Z_o$ is 28Ω, then the results of the calculations are d=39 µm and w=170 µm. When the conductor thickness t is to be changed by t=25 µm, it is known through experience that reducing the thickness by 25 µm, gives a new width w=145 µm. When a space d=39 µm between the same lines with respect to a stacked pair line w=200 µm is a microstrip line 153, it is possible to perform a fine processing up to w=145 µm. This image is shown in FIG. 23.

The width of 145 µm is insufficient for the design in which the pitch of the chip pad is 50 µm, and the fan-out line width w=100 µm. However, it is possible to solve this problem by tightening the conductor within the immediate vicinity of the electrode. The tightening wire length may be the same as the branched wire length, provided that (7×total delay time of tightening length)<the rise time.

Finally, FIG. 24 shows the connections between the chips, as well as the power source/ground distribution system. FIG. 24 shows an example of the inside of the package, or in other words, the arrangement of the connections between the chips, and the power source/ground pair lines of the chips mounted in the package. In the system shown in FIG. 24, it is apparent that by only providing the power source/ground common lines 161, the beta ground and the beta power source become unnecessary and are thus never provided. The length of the transmission line of the signal buses 167 which extend to from the CPU package 162 to the chips mounted in each of the respective memory packages 163–166, are different. However, in order to utilize the transmission delay of the clock signals which are supplied at the clock transmission line 168, the lengths may be the same. It is to be noted that power for the CPU package 162 and the memory packages 163–166 is supplied from the power source/ground common lines 161 via the power source pair lines 170, in the I/O space 169.

As described above, according the signal transmission system of the present embodiment, the process is such that the load supplied from the power source/ground pair lines, is transmitted without delay to the signal transistor, then it passes on the signal transmission line, causes the receiving transmitter to react, and the load which has been subjected to a reaction is converted to heat at the end terminal resistor. It is necessary to use these concepts for over 10 GHz signals, and by proposing the structures, components and methods above which realize these concepts, over 10 GHz band digital high speed signal transmission can be achieved.

The invention made by the inventors was described in detail based on the embodiments thereof. However, the present invention is not limited to the above embodiments and various modifications or alterations can be made without departing from the scope of the present invention.

The following is a brief description of the effects obtained one typical invention disclosed in the present application.

According to the present invention, by fabricating a structure which eliminates common ground and common power source for a circuit, and eliminate limits as far as possible for process of moving pulse energy (electric load) on the circuits and lines, and eliminated disconnected points that cause reflection, signal transmission technology for transmitting over 10 GHz band digital high speed signals, while keeping the system structure and element structure of the prior art can be provided.

What is claimed is:

1. A signal transmission system comprising:
   a plurality of driver circuits and a plurality of receiver circuits, included in a logic circuit and a memory circuit, respectively, and a plurality of signal transmission lines which electrically connect the driver circuits and the receiver circuits;
   wherein driver circuit has a differential output, and each receiver circuit has a differential input, and at an output terminal of the differential output, there is no connection to a power source or ground;
   there are no distribution wires in the signal transmission lines; and
   when the driver circuits and the receiver circuits are configured for a plurality of bits, all of the signal transmission lines have relatively the same physical structure and equal wire length and are substantially parallel wires, and wires of a fan-out wire arrangement connected to the transmission lines are configured as an arc so as to have equal length.

2. The signal transmission system according to claim 1, further comprising:
   a power supply path connected to a power input of the driver circuit;

the power supply path comprising a power source/ground transmission line pair, wherein each of a logic element circuit and a memory element circuit is connected by a dedicated power source/ground transmission line pair.

3. The signal transmission system according to claim 2, wherein a characteristic impedance of the power source/ground transmission line pair is equal to or less than a total characteristic impedance of the signal transmission lines divided by the number of driver circuits.

4. The signal transmission system according to claim 1, wherein each signal transmission line is one of a pair coplanar line, a stacked pair line, a guard stacked pair line, and a guard coplanar line; and
a distance between adjacent pair lines of the signal transmission lines is not less than twice the space of the pair line itself in cases of the pair coplanar line and stacked pair line, and not less one time the space of the pair line itself in the cases of the guard stacked pair line and the guard coplanar line.

5. A signal transmission system comprising:
a plurality of driver circuits and a plurality of receiver circuits, included in a logic circuit and a memory circuit, respectively, and a plurality of signal transmission lines which electrically connect the driver circuits and the receiver circuits;
wherein all signal transmission lines, from respective transistor output ports of the driver circuits, to respective transistor input ports of the receiver circuits, are pair lines, and only wires which approach a transistor contact portion geometrically are stand-alone wires, and the stand-alone wires are equal to or shorter than a gate pitch.

6. A signal transmission system comprising:
a plurality of driver circuits and a plurality of receiver circuits, included in a logic circuit and a memory circuit, respectively, and a plurality of signal transmission lines which electrically connect the driver circuits and the receiver circuits;
wherein a characteristic impedance of a said signal transmission line from a transistor output port of a sending end of a corresponding driver circuit, matches the characteristic impedance up to a transistor input port of an end terminal of a corresponding receiver circuit, and a terminal end resistor which matches the impedance present at the end terminal is provided; and
connection portions for connecting the signal transmission lines include an interlayer connection column, a via-hole and a connection stud whose impedance do not match, and have a relation represented by $tr>7tpd$, $t<7tpd$, where the time delay of an electromagnetic wave for a discontinuous portion of the connection portions is represented by tpd, pulse rise time is represented by tr, and pulse fall time is represented by tf.

7. A signal transmission system comprising:
a plurality of driver circuits and a plurality of receiver circuits, included in a logic circuit and a memory circuit, respectively; a plurality of signal transmission lines which electrically connect the driver circuits and the receiver circuits; and a power supply path which comprises a power source/ground transmission line pair;
wherein all of the signal transmission lines and each power source/ground transmission line pair have a configuration in which a TEM mode is maintained, and for a configuration in which electromagnetic waves leak into the air, a portion which leaks the electromagnetic waves is coated with a material having high specific dielectric constant such that an effective specific dielectric constant is matched with the specific dielectric constant of an inner portion dielectric constant.

8. A signal transmission system comprising:
a plurality of driver circuits and a plurality of receiver circuits included in a logic circuit and a memory circuit, respectively; and a plurality of signal transmission lines which electrically connect the driver circuits and the receiver circuits wherein a said driver circuit comprises adjacent complementary transistors which input an inverse signal or a clock, and which provide a varactor function.

9. The signal transmission system according to claim 8, wherein the complementary transistors include a complementary MOS, MES or bipolar transistor structure.

10. The signal transmission system according to claim 8, wherein:
a said receiver circuit includes a differential amplifier circuit, and the said driver circuit includes a switch transistor that maintains the effect of a complementary varactor with each of a plurality of varactors or with an inverse transistor of a similar type.

11. The signal transmission system according to claim 8, wherein the said driver circuit further comprises:
a step flip-flop circuit that outputs a signal and an inverse signal with an equal number of logic steps, the signal and inverse signal being output without skew,
wherein a switch transistor maintains the effect of a complementary varactor with each of a plurality of varactors or with an inverse transistor of a similar type.

* * * * *

UNITED STATES PATENT AND TRADEMARK OFFICE
CERTIFICATE OF CORRECTION

PATENT NO. : 7,173,449 B2  Page 1 of 1
APPLICATION NO. : 10/353040
DATED : February 6, 2007
INVENTOR(S) : Kanji Otsuka and Tamotsu Usami It is certified that error appears in the above-identified patent and that said Letters Patent is hereby corrected as shown below:

On the title page, add the following Assignee information:

(73) Assignees: Kanji Otsuka, Tokyo (JP)
Tamotsu Usami, Tokyo (JP)
Renesas Technology Corp., Tokyo (JP)
Oki Electric Industry Co., Ltd., Tokyo (JP)
Sanyo Electric Co., Ltd., Osaka (JP)
Sharp Kabushiki Kaisha, Osaka (JP)
Sony Corporation, Tokyo (JP)
Kabushiki Kaisha Toshiba, Tokyo (JP)
NEC Corporation, Tokyo (JP)
Matsushita Electric Industrial Co., Ltd., Osaka (JP)
Fujitsu Limited, Kawasaki-shi (JP)
Rohm Co., Ltd., Kyoto (JP)

Signed and Sealed this

Sixth Day of May, 2008

JON W. DUDAS
*Director of the United States Patent and Trademark Office*